United States Patent
Yamauchi et al.

(10) Patent No.: US 9,419,447 B2
(45) Date of Patent: Aug. 16, 2016

(54) BATTERY CONTROL DEVICE AND ELECTRICITY STORAGE DEVICE

(71) Applicant: Hitachi Automotive Systems, Ltd., Hitachinaka-shi, Ibaraki (JP)

(72) Inventors: Tatsumi Yamauchi, Hitachiota (JP); Akihiro Machida, Awa-gun (JP); Akihiko Kudo, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/612,448

(22) Filed: Feb. 3, 2015

(65) Prior Publication Data
US 2015/0145481 A1    May 28, 2015

Related U.S. Application Data

(63) Continuation of application No. 13/151,591, filed on Jun. 2, 2011, now Pat. No. 8,981,721.

(30) Foreign Application Priority Data

Jun. 4, 2010  (JP) .................................. 2010-128487

(51) Int. Cl.
*H02J 7/00* (2006.01)
*B60L 3/00* (2006.01)
(Continued)

(52) U.S. Cl.
CPC ............. *H02J 7/0013* (2013.01); *B60L 3/0046* (2013.01); *B60L 3/0069* (2013.01); *B60L 11/14* (2013.01);
(Continued)

(58) Field of Classification Search
CPC ... H02J 7/0013; H02J 7/0052; H01M 10/481; H01M 10/441; B60L 11/1853; B60L 11/1866; B60L 11/1868
USPC ........................................................ 320/116
See application file for complete search history.

(56) References Cited

U.S. PATENT DOCUMENTS 5,504,415 A    4/1996   Podrazhansky et al.
6,072,300 A    6/2000   Tsuji
(Continued)

FOREIGN PATENT DOCUMENTS

JP    2003-70179 A     3/2003
JP    2007-280872 A    10/2007
(Continued)

OTHER PUBLICATIONS

Japanese Office Action dated Jun. 2, 2015 (three (3) pages).
(Continued)

*Primary Examiner* — M'Baye Diao
(74) *Attorney, Agent, or Firm* — Crowell & Moring LLP

(57) ABSTRACT

A battery control device that controls a battery module in which a plurality of cell groups, in each of which a plurality of cells are connected in series, are connected in series or series-parallel, includes: a plurality of cell controller ICs that control each of the plurality of cell groups; and one or more connectors that are provided for connecting the plurality of cell controller ICs to the battery module; wherein: the plurality of cell controller ICs include first and second cell controller ICs that are provided in sequence, so as to control two or more of the cell groups that are connected in series; and an auxiliary connection member (a pin) is provided for connecting GND terminal side wiring of the first cell controller IC and VCC terminal side wiring of the second cell controller IC together, externally to the battery control device.

4 Claims, 11 Drawing Sheets

(51) Int. Cl.
    *B60L 11/14* (2006.01)
    *B60L 11/18* (2006.01)
    *B60L 15/20* (2006.01)
    *H01M 10/44* (2006.01)
    *H01M 10/48* (2006.01)
    *G01R 31/36* (2006.01)

(52) U.S. Cl.
    CPC ......... *B60L 11/1853* (2013.01); *B60L 11/1866* (2013.01); *B60L 11/1868* (2013.01); *B60L 15/20* (2013.01); *H01M 10/441* (2013.01); *H01M 10/482* (2013.01); *H02J 7/0052* (2013.01); *B60L 2200/26* (2013.01); *B60L 2210/10* (2013.01); *B60L 2210/30* (2013.01); *B60L 2220/14* (2013.01); *B60L 2240/421* (2013.01); *B60L 2240/545* (2013.01); *B60L 2240/547* (2013.01); *B60L 2240/549* (2013.01); *B60L 2270/20* (2013.01); *G01R 31/362* (2013.01); *G01R 31/3658* (2013.01); *H02J 7/0016* (2013.01); *Y02T 10/642* (2013.01); *Y02T 10/645* (2013.01); *Y02T 10/70* (2013.01); *Y02T 10/7005* (2013.01); *Y02T 10/7055* (2013.01); *Y02T 10/7061* (2013.01); *Y02T 10/7066* (2013.01); *Y02T 10/7077* (2013.01); *Y02T 10/7216* (2013.01); *Y02T 10/7241* (2013.01); *Y02T 10/7275* (2013.01)

(56) References Cited

U.S. PATENT DOCUMENTS

| | | | |
|---|---|---|---|
| 8,103,401 | B2 | 1/2012 | Kubo et al. |
| 8,253,378 | B2 | 8/2012 | Lee et al. |
| 8,354,825 | B2 | 1/2013 | Lee et al. |
| 2005/0242667 | A1 | 11/2005 | Emori et al. |
| 2007/0132429 | A1 | 6/2007 | Onuki et al. |
| 2008/0156551 | A1 | 7/2008 | Kawahara et al. |
| 2008/0219337 | A1 | 9/2008 | Kawata et al. |
| 2008/0284375 | A1 | 11/2008 | Nagaoka et al. |
| 2009/0085516 | A1 | 4/2009 | Emori et al. |
| 2009/0087722 | A1 | 4/2009 | Sakabe et al. |
| 2009/0091332 | A1 | 4/2009 | Emori et al. |
| 2009/0130541 | A1 | 5/2009 | Emori et al. |
| 2009/0169987 | A1 | 7/2009 | Miyazaki et al. |
| 2009/0198399 | A1 | 8/2009 | Kubo et al. |
| 2009/0284224 | A1 | 11/2009 | Miyazaki et al. |
| 2010/0001737 | A1* | 1/2010 | Kubo ............... B60L 11/18 324/434 |
| 2010/0141208 | A1 | 6/2010 | Deal et al. |
| 2010/0244847 | A1 | 9/2010 | Kudo et al. |
| 2012/0025769 | A1 | 2/2012 | Kikuchi et al. |
| 2012/0133370 | A1 | 5/2012 | Kubo et al. |
| 2013/0076301 | A1 | 3/2013 | Bastami |
| 2013/0187659 | A1 | 7/2013 | Kubo et al. |

FOREIGN PATENT DOCUMENTS

| | | |
|---|---|---|
| JP | 2008-220074 A | 9/2008 |
| JP | 2008-289234 A | 11/2008 |
| JP | 2009-89484 A | 4/2009 |
| JP | 2009-89486 A | 4/2009 |
| JP | 2009-89487 A | 4/2009 |
| JP | 2009-89488 A | 4/2009 |
| JP | 2009-183025 A | 8/2009 |
| JP | 2010-16928 A | 1/2010 |
| JP | 2010-228523 A | 10/2010 |
| JP | 2010-249793 A | 11/2010 |

OTHER PUBLICATIONS

Japanese Office Action with English translation thereof dated Oct. 1, 2013 {Seven (7) pages}.

* cited by examiner

BATTERY CONTROL DEVICE AND ELECTRICITY STORAGE DEVICE

CROSS REFERENCE TO RELATED APPLICATION

This application is a continuation of U.S. application Ser. No. 13/151,591, filed Jun. 2, 2011, which claims priority from Japanese Patent Application No. 2010-128487 filed Jun. 4, 2010, the disclosures of which are expressly incorporated by reference herein.

BACKGROUND OF THE INVENTION

1. Field of the Invention

The present invention relates to a battery control device and to an electricity storage device.

2. Description of Related Art

In an electric automobile or a hybrid type automobile, a battery module is used in which a plurality of assembled batteries, in each of which a plurality of secondary cells (unit cells) such as lithium cells or the like are connected in series or in series-parallel, are themselves connected in series or in series-parallel. Furthermore, an assembly of a plurality of these battery modules connected in series or in series-parallel, together with a battery control circuit that controls these battery modules, is used as an electricity storage device.

When a large number of secondary cells are connected in series and a control device for detecting the voltages of these cells is connected thereto, precautions are required in order for high current not to flow to the control device and for high voltage not to be applied to its internal integrated circuits, since this would cause them to be damaged or to fail. For example in Japanese Laid-Open Patent Publication 2007-280872, when a battery pack (i.e. an battery assembly) in which a plurality of secondary cells are connected in series-parallel is to be connected to a control device, a special type of connector is used in which the lengths of the connector pins vary, so that the voltage detection lines are connected in order from the low potential side of battery voltage within the battery pack.

SUMMARY OF THE INVENTION

As disclosed in Japanese Laid-Open Patent Publication 2007-280872, when a number of secondary cells are connected in series, the overall voltage at the very most may reach 10 V, and it is possible for elements used in such a battery control device to cope with voltages of this level by the implementation of countermeasures such as endowing them with suitable withstand voltage and so on. However, with an electric automobile or a hybrid type automobile or the like, when a plurality of battery modules are connected in series or in series-parallel, the overall voltage becomes very much greater than in the case of a single battery assembly, and may reach several hundreds of volts. In this type of case when a plurality of assembled batteries are connected together, yet further countermeasures are required for connecting this plurality of assembled batteries to a battery control device for controlling them.

According to the 1st aspect of the present invention, a battery control device that controls a battery module in which a plurality of cell groups, in each of which a plurality of cells are connected in series, are connected in series or in series-parallel, comprises: a plurality of cell controller ICs that control each of the plurality of cell groups; and one or more connectors that are provided for connecting the plurality of cell controller ICs to the battery module; wherein: the plurality of cell controller ICs include first and second cell controller ICs that are provided in sequence, so as to control two or more of the cell groups that are connected in series; and an auxiliary connection member (a pin) is provided for connecting GND terminal side wiring of the first cell controller IC and VCC terminal side wiring of the second cell controller IC together, externally to the battery control device.

According to the 2nd aspect of the present invention, in a battery control device according to the 1st aspect, it is preferred that a same number of cell controller ICs as the plurality of cell groups are provided; and each of the plurality of cell controller ICs controls one cell group that is attached to that cell controller IC.

According to the 3rd aspect of the present invention, in a battery control device according to the 1st or the 2nd aspect, it is preferred that only one of the one or more connectors is provided for the plurality of cell controllers, and the auxiliary connection member is provided integrally with that connector.

According to the 4th aspect of the present invention, in a battery control device according to the 1st or the 2nd aspect, it is preferred that one of the one or more connectors is provided for each of the plurality of cell controllers; and an auxiliary connector, to which the auxiliary connection member (pin) is integrally provided, is provided separately from the connectors.

According to the 5th aspect of the present invention, in a battery control device according to any one of the 1st through 5th aspects, it is preferred that one of the auxiliary connection members is provided for each pair of successive cell controller ICs.

According to the 6th aspect of the present invention, in a battery control device according to the 5th aspect, it is preferred that the auxiliary connection members are provided to each of two successive cell controller ICs among a group of two or more of the plurality of cell controller ICs provided in succession; and the battery control device comprises a battery control device side auxiliary connector for establishing connection by all of the auxiliary connection members of the group all together.

According to the 7th aspect of the present invention, in a battery control device according to the 6th aspect, it is preferred that a connection member for establishing connection between a VCC terminal side wiring of a highest level cell controller IC of the group and a highest level voltage detection line of the cell group connected to this highest level cell controller IC, and the connection member for establishing connection between a GND terminal side wiring of a lowest level cell controller IC of the group and a lowest level voltage detection line of a cell group connected to this lowest level cell controller IC, are provided as integrated with the battery control device side auxiliary connector.

According to the 8th aspect of the present invention, in a battery control device according to any one of the 1st through 4th aspects, it is preferred that the plurality of cell controller ICs includes one or more sets, each of which includes a first cell controller IC group that includes two or more cell controller ICs, and a second cell controller IC group that includes two or more cell controller ICs, provided in succession to the first cell controller IC group; and one of the auxiliary connection members is provided for each of these sets of the first cell controller IC group and the second cell controller IC group.

According to the 9th aspect of the present invention, in a battery control device according to any one of the 1st through 8th aspects, it is preferred that an electronic component for current limitation is connected between the GND terminal side wiring and the VCC terminal side wiring.

According to the 10th aspect of the present invention, an electricity storage device, comprises: a battery control device according to any one of the 1st through 9th aspects; a battery module in which a plurality of cell groups, in each of which the plurality of cells are connected in series, are connected in series or series-parallel; and a connector on the battery module side.

According to the 11th aspect of the present invention, a vehicle which can be driven electrically, comprises: an electricity storage device according to the 10th aspect, and an electric motor for propulsion driven by electrical power controlled by the electricity storage device.

DESCRIPTION OF THE PREFERRED EMBODIMENTS

Figure 1:
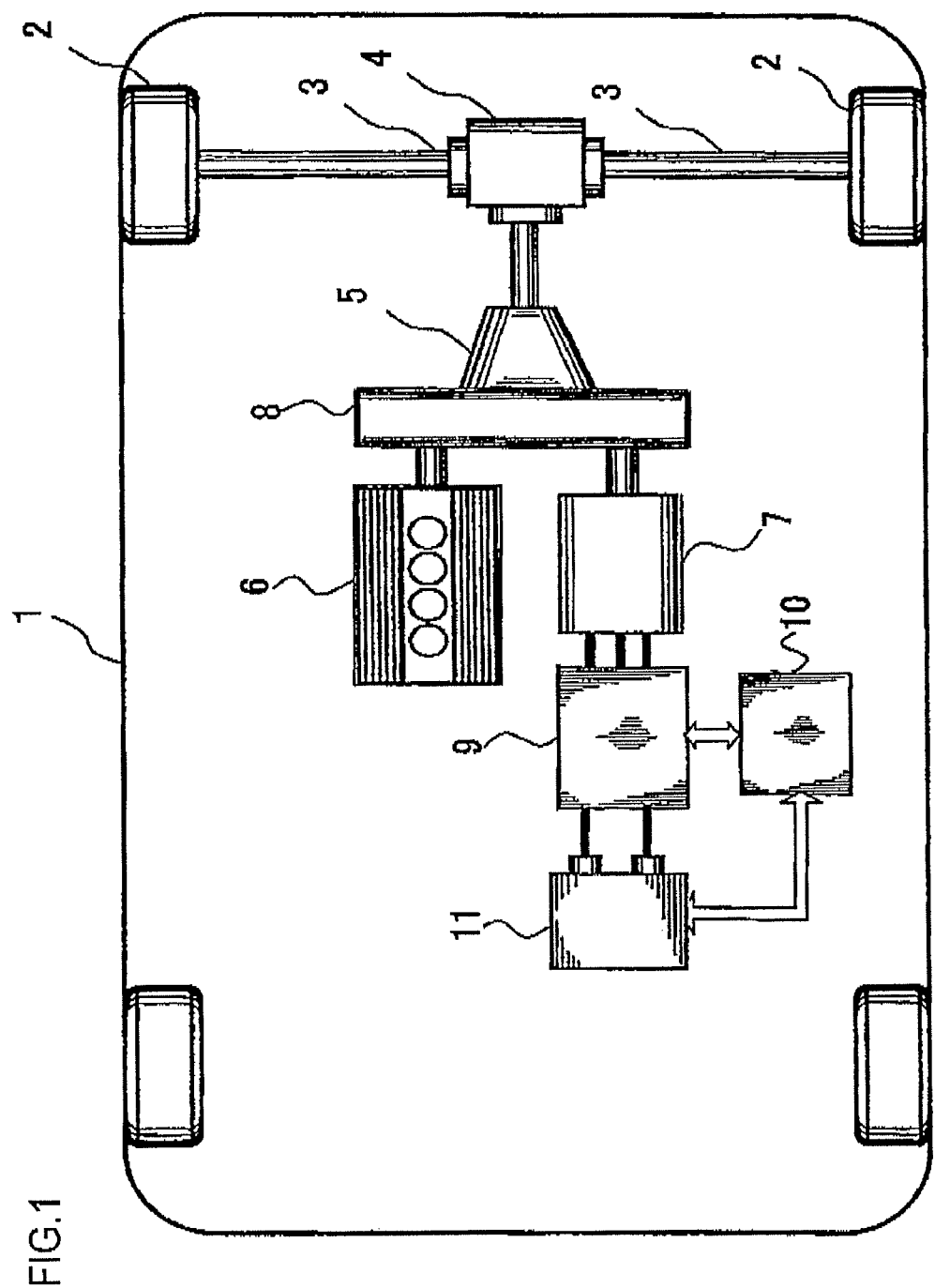
FIG. 1 is a block diagram showing the structure of a drive system of a hybrid automobile.

Various embodiments for implementation of the present invention will now be explained with reference to the figures.

In the embodiments explained below, cases are described in which the battery control device and the electricity storage device according to the present invention are applied to a drive system for a hybrid automobile. However it should be understood that the structures of the embodiments described below could also be applied to a railroad vehicle such as a hybrid locomotive or the like. Moreover, the battery control device and the electricity storage device according to the present invention could also be applied to a pure electric automobile.

General Structure of a Drive System for a Hybrid Automobile

First a drive system for a hybrid automobile will be explained with reference to FIG. 1. In this drive system for a hybrid automobile shown in FIG. 1, two wheel axles 3 that are mechanically connected to drive wheels 2 are connected to a differential gear 4, and an input shaft of the differential gear 4 is connected to a transmission 5. And, as sources of propulsive power, an engine 6 (i.e. an internal combustion engine) and an electrically operated motor-generator 7 are connected to a drive force changeover device 8, and this selects the drive power from either the engine 6 or the motor-generator 7 and inputs that drive power to the transmission 5.

The format shown in FIG. 1 is a so called parallel hybrid format, in which the engine 6 and the motor-generator 7 are arranged in parallel as drive sources for the drive wheels 2. Moreover, as a drive system for a hybrid automobile, there is also a so called series hybrid format in which it is arranged for the energy of the engine 6 to be used as a drive source for the motor-generator 7 while using the energy of the motor-generator 7 as a drive source for the drive wheels 2, in other words in which it is arranged for the engine 6 to charge up an electricity storage device; and the present invention could be employed with either of these formats, or could be employed with a combined format.

An electricity storage device 11 that constitutes a power supply device is electrically connected to the motor-generator 7 via an electrical power conversion device 9. And this electrical power conversion device 9 is controlled by a control device 10.

When the motor-generator 7 is being operated as an electric motor, the electrical power conversion device 9 functions as a DC-AC conversion circuit that converts the DC power outputted from the electricity storage device 11 into three phase AC power. Moreover, during regenerative braking when the motor-generator 7 is operating as a generator, the electrical power conversion device 9 functions as an AC-DC conversion circuit that converts three phase AC power outputted from the motor-generator 7 into DC power. The positive and negative terminals of a battery module in the electricity storage device 11 are electrically connected to the DC side of the electrical power conversion device 9. And three series circuits of two switching semiconductor elements are provided on the AC side of the electrical power conversion device 9, with the intermediate point between the two switching semiconductor elements of each of these series circuits being electrically connected to a respective one of the three armature windings of the motor-generator 4 for the three phases.

The motor-generator 7 functions as a prime mover for driving the drive wheels 2, and includes an armature (i.e. a stator) and a field magnet (i.e. a rotor) that is rotatably supported so as to confront the armature, and is a three phase AC synchronous rotating electrical machine of the permanent magnet type that employs the magnetic flux of a permanent magnet for field magnetism. This motor-generator 7 generates the rotational power needed for driving the drive wheels 2 on the basis of the magnetic interaction between a rotating magnetic field that is created by the three phase AC supplied to the armature winding and that rotates at synchronous speed, and the magnetic flux of the permanent magnet.

When the motor-generator 7 is operating as an electric motor, the armature receives supply of three phase AC electrical power controlled by the electrical power conversion device 9 and generates a rotating magnetic field. On the other hand, when the motor-generator 7 is operating as a generator, the armature constitutes a location where three phase AC electrical power is generated due to magnetic flux linkage, since it includes the armature iron core (i.e. the stator iron core) that constitutes a magnetic body, and the three phase armature winding (i.e. the stator winding) that is installed upon this armature iron core. The field magnet is a location at which field magnetic flux is generated when the motor-generator 7 is operating as an electric motor or as a generator, and it includes a field magnet iron core (i.e. a rotor iron core) that is a magnetic body, and a permanent magnet that is installed upon this field magnet iron core.

For this motor-generator 7, it would also be acceptable to employ a synchronous three phase AC rotating electrical machine of the magnetic field winding type that generates rotational power on the basis of the magnetic operation of a rotating magnetic field that rotates at synchronous speed, created by three phase AC electrical power supplied to an armature winding, and a magnetic flux created by the excitation of a winding, or a three phase AC induction rotating electrical machine or the like. In the case of a synchronous three phase AC rotating electrical machine of the magnetic field winding type, the structure of the armature is fundamentally the same as that of a permanent field magnet type synchronous three phase AC rotating electrical machine. On the other hand, the structure of the field magnet is different: it includes a field coil (i.e. a rotor winding) wound upon a field magnet iron core that is a magnetic body. It should be understood that, with a synchronous three phase AC rotating electrical machine of the magnetic field winding type, sometimes a permanent magnet is installed upon the field magnet iron core upon which the field coil is wound, and this restrains leakage of the magnetic flux generated by the winding. Magnetic flux is generated by the field coil receiving supply of a field magnet current from an external power supply and being excited thereby.

The drive force changeover device 8, the transmission 5, and, via the differential gear 4, the wheel axles of the drive wheels 2 are all mechanically connected to the motor-generator 7. The transmission 5 changes the rotational speed of the rotational power outputted from the motor-generator 7, and transmits the resulting power to the differential gear 4. The differential gear 4 transmits the rotational power outputted from the transmission to the left and right wheel axles 3. And the drive force changeover device 8 is changed over according to the operation of a higher ranking control device (not shown in the figures) such as an engine controller or a travel controller or the like, and operates either as an electric motor or as a generator by being changed over during acceleration under engine control, engine starting away from idle stop by the motor-generator 7, regenerative braking cooperation under brake control, and so on.

The electricity storage device 11 is an in-vehicle drive power supply that is charged up by electrical power generated by the motor-generator 7 during regenerative operation, and that discharges the electrical power needed for driving the motor-generator 7 when it is operating as a motor. For example, it may be a battery system including several tens of lithium ion cells and having a rated voltage of 100 V or more. It should be understood that the detailed structure of this electricity storage device 11 will be explained hereinafter.

Apart from the motor-generator 7, an electrically operated actuator that supplies power to in-vehicle auxiliary machinery (for example, a power steering device or an air brake), a low voltage battery that constitutes a power supply whose rated voltage is lower than that of the electricity storage device 11 and is used for providing operating electrical power to in-vehicle electrical or electronic equipment (for example lights, audio equipment, or an in-vehicle electronic control device), and so on are electrically connected to the electricity storage device 11 via a DC/DC converter. This DC/DC converter is a voltage raising/lowering device that lowers the output voltage of the electricity storage device 11 for supply to the electrically operated actuator or to the low voltage battery or the like, and that raises the output voltage of the low voltage battery for supply to the electricity storage device 11 or the like. A lead-acid battery of rated voltage 12 V may be used for the low voltage battery. It would also be acceptable to use a lithium ion battery or a nickel-hydrogen battery having the same rated voltage for the low voltage battery.

During power running operation of the hybrid automobile 1 (i.e. during starting off from rest, acceleration, normal traveling, and so on), when the operation of the electrical power conversion device 9 is controlled by supply of a positive torque command to the control device 10, DC electrical power stored in the electricity storage device 11 is converted by the electrical power conversion device 9 into three phase AC power, and is then supplied to the motor-generator 7. Due to this, the motor-generator 7 is driven so as to generate rotational power. This rotational power that is generated is transmitted to the wheel axles 3 via the drive force changeover device 8, the transmission 5, and the differential gear 4, and drives the drive wheels 2.

On the other hand, during regenerative operation of the hybrid automobile 1 (i.e. during deceleration, braking, and so on), when the operation of the electrical power conversion device 9 is controlled by supply of a negative torque command to the control device 10, three phase AC power generated by the motor-generator 7 that is being driven by the rotational power of the drive wheels 2 is converted by the electrical power conversion device 9 into DC electrical power, that is then stored in the electricity storage device 11. Due to this, the DC electrical power that has thus been obtained by conversion charges up the electricity storage device 11.

Along with calculating a current command value from a torque command value that is outputted from a higher ranking control device (not shown in the figures), the control device 10 also calculates a voltage command value on the basis of the difference between this current command value and the actual value of the current that is flowing through the electrical power conversion device 9, and then generates a PWM (pulse width modulation) signal on the basis of this voltage command that has been calculated and supplies this PWM signal to the electrical power conversion device 9.

Overall Structure of the Electricity Storage Device 11

Next, with reference to FIG. 2, a drive device for an electric motor will be explained that can be applied to an electric automobile or to a hybrid type automobile, and that is equipped with an electricity storage device including a battery control device according to the present invention.

Figure 2:
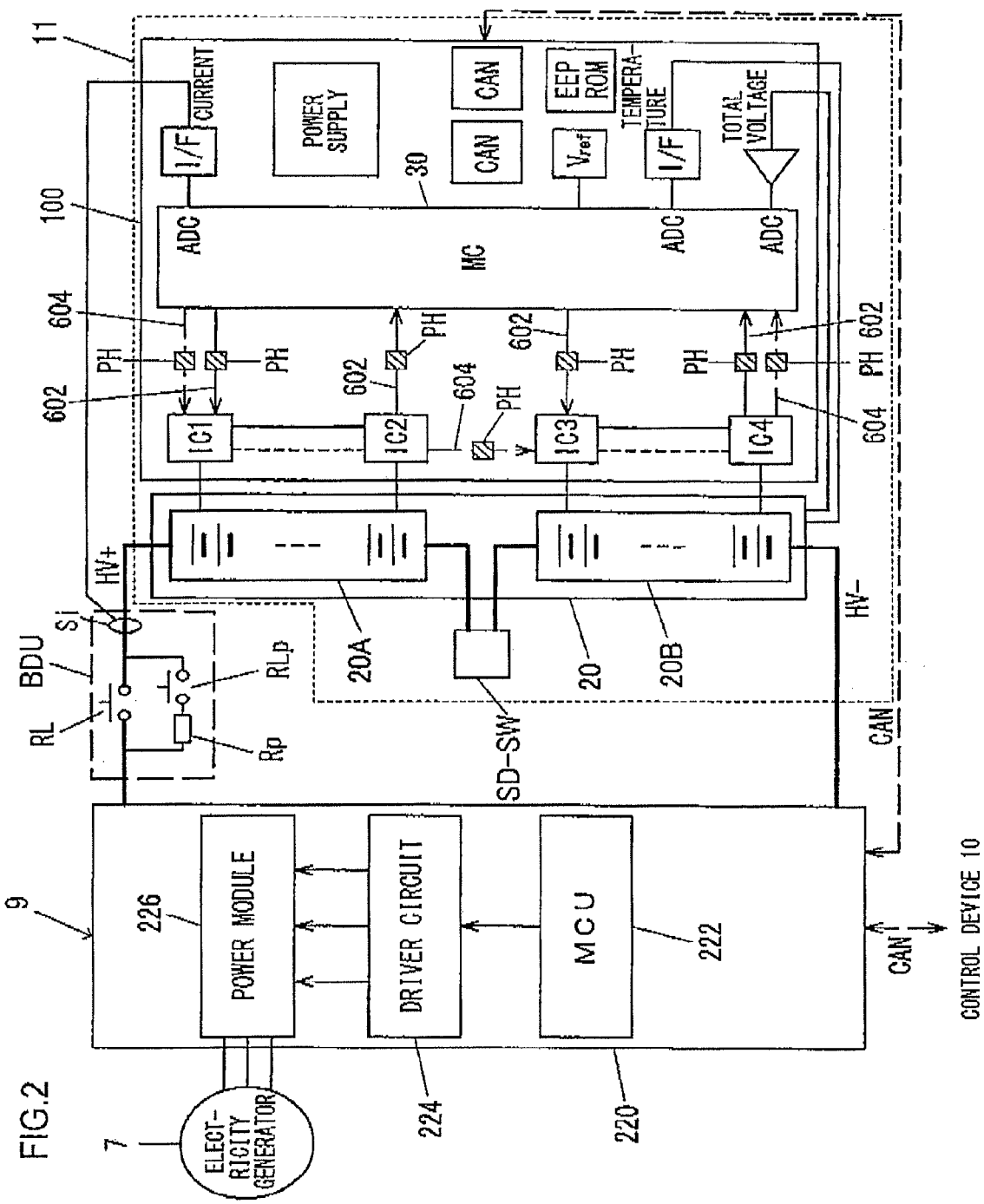
FIG. 2 is a block diagram showing a drive system for a rotating electrical machine for a vehicle.

FIG. 2 is a block diagram showing a drive system for a rotating electrical machine for a vehicle. The drive system shown in FIG. 2 includes a battery module 20, a battery control device 100 that monitors this battery module 20, an inverter device 220 that converts DC power from the battery module 20 into three phase AC power, and a motor-generator 7 for driving the vehicle. The motor-generator 7 is driven by the three phase AC power from the inverter device 220. The inverter device 220 and the battery control device 100 are connected via CAN communication, and the inverter device 220 functions as a higher ranking controller with respect to the battery control device 100. Moreover, the inverter device 220 also operates on the basis of command information from a control device 10 (refer to FIG. 1).

The inverter device 220 includes a power module 226, an MCU 222 that controls the inverter device, and a driver circuit 224 for driving the power module 226. The power module 226 converts DC power supplied from the battery module 20 into three phase AC power for driving the motor-generator 7 as a motor. It should be understood that a high capacity smoothing capacitor of capacitance around 700 μF to around 2000 μF is provided between the high voltage lines HV+ and HV− that are connected to the power module 226, although this capacitor is not shown in the figure. This smoothing capacitor operates to reduce noise in the voltage supplied to the integrated circuits provided in the battery control device 100.

In the state when the inverter device 220 starts its operation, the charge in the smoothing capacitor is approximately zero, and when a relay RL closes a large initial current flows into the smoothing capacitor. And there is some fear that, due to this high current, the relay RL may fuse and suffer damage or failure. In order to solve this problem, when starting driving the motor-generator 7 according to a command from the control device 10, the MCU 222 drives a pre-charge relay RLP from the opened state to the closed state so as to charge up the smoothing capacitor, and thereafter drives the relay RL from the opened state to the closed state, thus starting supply of electrical power from the battery module 20 to the inverter device 220. During this charging up of the smoothing capacitor, the charging current is limited to a maximum by being passed through a resistor RP. By performing this type of operation, along with protecting the relay circuit, also it is possible to reduce the maximum current that flows through the cells and the inverter device 220 to within a predetermined value, so that it is possible to maintain high security.

It should be understood that this inverter device 220 can also operate the motor-generator 7 as a generator during vehicle braking, by controlling the phase of the AC power generated by the power module 226 with respect to the phase of the rotor of the motor-generator 7. In other words, regenerative braking control is performed, and the power generated due to driving of the generator is recovered to the battery module 20, thus charging up the battery module 20. Moreover, when the state of charge of the battery module 20 drops to be lower than a reference state, then the inverter device 220 operates the motor-generator 7 as a generator. The three phase AC power that is generated by the motor-generator 7 is converted into DC power by the power module 226, and is supplied to the battery module 20. As a result, the battery module 20 is charged up.

On the other hand, when the motor-generator 7 is operating as a motor for producing propulsive power, according to commands from the control device 10, the MCU 222 controls the driver circuit 224 and thereby controls the switching operation of the power module 226, so as to create a rotating magnetic field that leads with respect to the rotation of the rotor of the motor-generator 7. In this case, the DC power from the battery module 20 is supplied to the power module 226. Moreover, when the battery module 20 is to be charged up during regenerative braking control, the MCU 222 controls the driver circuit 224 and controls the switching operation of the power module 226, so as to create a rotating magnetic field that trails with respect to the rotation of the rotor of the motor-generator 7. In this case, the electrical power from the motor-generator 7 is supplied to the power module 226, and the DC power from the power module 226 is supplied to the battery module 20. As a result, the motor-generator 7 operates as a generator.

The power module 226 of the inverter device 220 performs operation to go continuous and discontinuous at high speed, and thereby performs conversion between DC power and AC power. Since at this time high currents are intercepted and connected at high speed, large voltage fluctuations are generated due to the inductances inherent in the DC circuitry. The high capacitance smoothing capacitor mentioned previously is provided in order to suppress these voltage fluctuations.

As an example, this battery module 20 includes two battery module blocks 20A and 20B that are connected in series. Each of these battery module blocks 20A and 20B includes a plurality of cell groups connected in series, in each of which a plurality of cells are connected in series. The battery module block 20A and the battery module block 20B are connected in series via a service disconnection unit SD-SW for maintenance and inspection, in which a switch and a fuse are connected in series. By opening this service disconnection unit SD-SW, the series connection of the circuit is intercepted, and current still does not flow, even supposing that a circuit connection to the vehicle body is established in one spot at some location on the battery module block 20A or 20B. It is possible to maintain high security with this type of structure. Moreover, even if during inspection the operator should make contact with HV+ and/or HV−, still safety is preserved, because high voltage is not applied to his body.

The battery disconnection unit BDU including the relay RL, the resistor RP, and the pre-charge relay RLP is provided upon the high voltage line HV+ between the battery module 20 and the inverter device 220. In this battery disconnection unit BDU, the series circuit of the resistor RP and the pre-charge relay RLP is connected in parallel with the relay RL.

This battery control device 100 principally performs measurement of the voltages of the cells, measurement of the total voltage, measurement of the current, adjustment of the cell temperatures and of the capacities of the cells, and so on. For these purposes, a plurality of ICs for cell control (i.e. integrated circuits) are provided as cell controllers. The plurality of cells that are provided within each of the battery module blocks 20A and 20B are divided into a plurality of cell groups (i.e. battery assemblies), and, for each of these cell groups, one of the cell controller ICs is provided to control all of the cells included in that cell group.

In the following explanation, for the sake of simplicity, it will be supposed that each of the cell groups includes just four cells. Furthermore, it will be supposed that each of the battery module blocks 20A and 20B includes just two cell groups (20A1 and 20A2, and 20B1 and 20B2). However, the number of cells included in each of the cell groups is not to be considered as being limited to four, since there could be five or more; and moreover, for example, a cell group of four cells and a cell group of six cells could be combined to form a battery module block. As for the cell controller ICs that are provided to correspond to the cell groups, ones may be used that are designed to be usable respectively for cell groups in which the number of cells is four, and also for cell groups in which the number of cells is five or more.

Furthermore, in order to obtain the considerable voltage and current that are needed for an electric automobile or for a hybrid automobile, each of the battery module blocks described above may include a plurality of cell groups connected in series or in series-parallel, and moreover a plurality of such battery module blocks may be connected in series or in series-parallel.

Each of the cell controllers IC1 through IC4 that control the cell groups has a communication system 602 and a one bit communication system 604. With the communication system 602 for reading the cell voltage values and for transmission of commands of various types, serial communication with a microcomputer 30 that controls the battery module 20 is performed by a daisy chain method via an insulating element PH (for example, a photocoupler). And the one bit communication system 604 transmits an anomaly signal when cell overcharging has been detected. In the example shown in FIG. 2, the communication system 602 is divided into a higher ranking communication path for the cell controllers IC1 and IC2 of the battery module block 20A, and a lower ranking communication path for the cell controllers IC3 and IC4 of the battery module block 20B.

Each of these cell controller ICs performs anomaly diagnostics, and, if it has itself detected an anomaly, or if it has received an anomaly signal from a higher ranking cell controller IC at its receive terminal FFI, then it transmits an anomaly signal from its transmit terminal FFO. On the other hand, if an anomaly signal that it has already received at its receive terminal FFI is cancelled, or if it decides that the anomaly that it previously detected itself has disappeared and that the situation is now normal, then it cancels the anomaly signal that was transmitted from its transmit terminal FFO. In this embodiment, this anomaly signal is a one bit signal.

Although the microcomputer 30 does not transmit any anomaly signal to the cell controller ICs, it may send a test signal via the one bit communication system 604, i.e. a pseudo-anomaly signal, in order to diagnose whether or not the one bit communication system 604 (that constitutes the transmission path for anomaly signals) is operating correctly. Upon receipt of this test signal, the cell controller IC1 sends an anomaly signal to the communication system 604, and this anomaly signal is received by the cell controller IC2. And the anomaly signal is transmitted from the cell controller IC2 through the cell controllers IC3 and IC4 in order, and finally is returned from the cell controller IC4 to the microcomputer 30. If the communication system 604 is operating normally, then the pseudo-anomaly signal that was transmitted from the microcomputer 30 is returned to the microcomputer 30 via the communication system 604. It is possible to perform diagnostics upon the communication system 604 by the microcomputer 30 receiving the pseudo-anomaly signal in this manner, so that the reliability of the system is enhanced.

A current sensor Si such as a Hall element or the like is installed within the battery disconnection unit BDU, and the output of this current sensor Si is inputted to the microcomputer 30. Signals related to the total voltage of the battery module 20 and to its temperature are also inputted to the microcomputer 30, and are measured by A/D converters (ADCs) of the microcomputer 30. Temperature sensors are provided at a plurality of locations within the battery module blocks 20A and 20B.

Structure of the Cell Controller ICs

Next, the schematic circuit structure of the cell controller ICs that are used in the battery control device and in the electricity storage device according to the present invention will be explained with reference to FIGS. 2 and 3.

Figure 3:
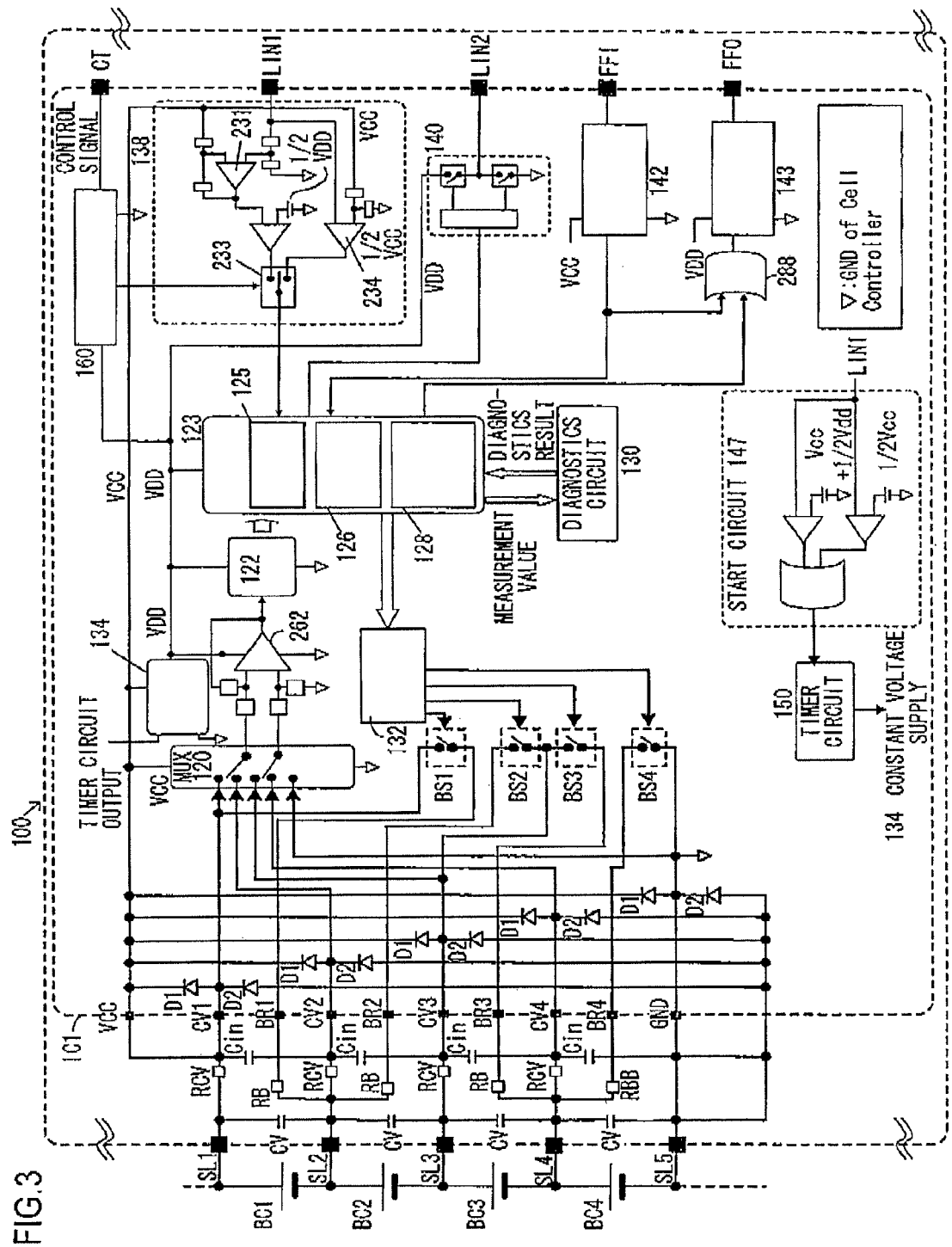
FIG. 3 is a figure schematically showing the internal circuitry of an IC for cell control (i.e. of a cell controller IC)

FIG. 3 is a figure schematically showing blocks internal to one of these cell controller ICs (i.e. blocks internal to one of the ICs for cell control), and shows, as an example, the cell controller IC1 that is connected to the four cells BC1 through BC4 of the cell group 20A1. It should be understood that the other ICs have similar structures, although the explanation thereof will be omitted. Furthermore, as described above, while in this example four of the cells BC are provided in the cell group 20A1, this is not to be considered as being limitative; there number of cells could be six or more. The cell controllers IC are designed to be able to cope with the number of cells included in each cell group. For example if six balancing switches are provided in advance so as to be able to cope with six cells, nevertheless, if the number of cells included in each of the cell groups is actually only four, then only four among these six balancing switches are used.

The cell controller IC1 is provided with a multiplexer 120 and an analog to digital converter 122A that serve as a battery state detection circuit, and with an IC control circuit 123, a diagnostics circuit 130, transmission input circuits 138 and 142, transmission output circuits 140 and 143, a start circuit 147, a timer circuit 150, a control signal detection circuit 160, a differential amplifier 262, and an OR circuit 288.

The terminal voltages of the cells BC1 through BC4 are inputted to the multiplexer 120 via voltage detection lines SL1 through SL5, voltage input terminals CV1 through CV4, and a GND terminal. The multiplexer 120 selects the voltage between any one of the voltage input terminals CV1 through CV4 and the GND terminal, and inputs this voltage between the terminals to a differential amplifier 262. The output of this differential amplifier 262 is converted to a digital value by an analog to digital converter 122A. After having been thus converted to a digital value, this voltage between terminals is sent to the IC control circuit 123, and is held internally by a data hold circuit 125. The terminal voltages of the various cells BC1 through BC4 that are inputted at the voltage input terminals CV1 through CV4 and the GND terminal are biased with respect to the GND potential of the cell controller IC1 by the terminal voltages of the four cells that are connected in series. However, the influences of the above described biasing potentials are eliminated by the differential amplifier 262 described above, so that analog values based upon the terminal voltages of the various cells BC1 through BC4 are inputted to the analog to digital converter 122A.

The IC control circuit 123 has a calculation function, and also incorporates the data hold circuit 125, a timing control circuit 126 that periodically performs voltage measurement and state diagnostics, and a diagnostics flag hold circuit 128 in which diagnostics flags are set from the diagnostics circuit 130. The IC control circuit 123 decodes the contents of communication commands inputted from the transmission input circuit 138, and performs processing according to those contents. Such commands include, for example, commands requesting the measurement values for the voltage between terminals of the cells, commands requesting discharge operation for adjusting the charge states of cells, commands for starting the operation of this cell controller IC (wake up commands), commands for stopping that operation (sleep commands), commands requesting address setting, and so on.

The diagnostics circuit 130 performs various types of diagnostics on the basis of the measurement values from the IC control circuit 123, for example over-charge diagnostics and over-discharge diagnostics. The data hold circuit 125 includes, for example, a register circuit, and stores the voltages between the terminals of the cells BC1 through BC4 that have been detected in correspondence with those cells BC1 through BC4, and also holds other detected values in addresses determined in advance so that they can be read out.

Power supply voltages VCC and VDD of at least two types are used in the internal circuitry of IC1. In the example shown in FIG. 3, the voltage VCC is the total voltage of the cell group consisting of the cells BC1 through BC4 that are connected in series, while the voltage VDD is generated by a constant voltage power supply 134. The multiplexer 120 and the transmission input circuits 138 and 142 for signal transmission operate with the higher voltage VCC. Moreover, the analog to digital converter 122A, the IC control circuit 123, the diagnostics circuit 130, and the transmission output circuits for signal transmission 140, 143 operate with the lower voltage VDD.

The signal received at a receive terminal LIN1 of the cell controller IC1 is inputted to the transmission input circuit 138, while the signal received at its receive terminal FFI is inputted to the transmission input circuit 142. The transmission input circuit 142 has a similar structure to that of the transmission input circuit 138. The transmission input circuit 138 includes a circuit 231 that receives a signal from another adjacent cell controller IC, and a circuit 234 that receives a signal from a photocoupler PH.

In the case of the cell controller IC1, as shown in FIG. 3, the signal from the photocoupler PH is inputted to the receive terminal LIN1; while, in the case of the cell controller IC2, the signal from the adjacent cell controller IC1 is inputted to the receive terminal LIN1. Due to this, which of the circuits 231 and 234 is to be used is selected by a changeover device 233 on the basis of a control signal applied to the control terminal CT of FIG. 3. This control signal that is applied to the control terminal CT is inputted to the control signal detection circuit 160, and the changeover device 233 performs its changeover operation according to a command from the control signal detection circuit 160.

In other words, when a signal from a higher ranking controller (i.e. the microcomputer 30) is inputted to the most significant one of the cell controller ICs in the transmission direction, in other words to the receive terminal LIN1 of the cell controller IC1, then the changeover device 233 closes to its lower contact point, and the output signal of the circuit 234 is outputted from the transmission input circuit 138. On the other hand, when a signal from an adjacent cell controller IC is inputted to the receive terminal LIN1 of a lower ranking cell controller IC that is other than the highest ordered one in the transmission direction, then the changeover device 233 closes to its upper contact point, and the output signal of the circuit 232 is outputted from the transmission input circuit 138. In the case of IC2 shown in FIG. 3, since the signal is inputted to the transmission input circuit 138 from the adjacent IC1, accordingly the changeover device 233 closes to its upper contact point. And, since the peak values of the output waveforms at the output from the higher ranking controller (i.e. the microcomputer 30) and at the output from the transmit terminal LIN2 of the adjacent cell controller IC are different, accordingly the threshold values at which the decisions take place are different. Due to this, the changeover device 233 of the circuit 138 comes to be changed over on the basis of the control signal at the control terminal CT. It should be understood that the communication system 604 has a similar structure.

A communication command that is received at the receive terminal LINT is inputted to the IC control circuit 123 via the transmission input circuit 138. And the IC control circuit 123 outputs data and a command to the transmission output circuit 140 corresponding to the communication command that it has received. This data and command are transmitted via the transmission output circuit 140 to the transmit terminal LIN2. It should be understood that the transmission output circuit 143 has a similar structure to that of the transmission output circuit 140.

The signal that has been received from the terminal FFI is used for transmitting an anomaly state signal (i.e. an over-charge signal). When a signal that indicates an anomaly is received from the terminal FFI, then this signal is inputted to the transmission output circuit 143 via the transmission input circuit 142 and an OR circuit 288, and is outputted from the transmission output circuit 143 via the terminal FFO. Furthermore, when an anomaly is detected by the diagnostics circuit 130, a signal indicating an anomaly is inputted from the diagnostics flag hold circuit 128 to the transmission output circuit 143 via the OR circuit 288, without any relationship to any signal received at the terminal FFI, and is outputted from the transmission output circuit 143 via the terminal FFO.

When a signal that has arrived by transmission from the adjacent cell controller IC or the photocoupler PH is received by the start circuit 147, the timer circuit 150 operates, and the voltage VCC is supplied to the constant voltage power supply 134. Due to this operation, the constant voltage power supply 134 goes into its operational state, and outputs the constant voltage VDD. When this constant voltage VDD is outputted from the constant voltage power supply 134, the cell controller IC2 awakes from its sleep state and goes into its operational state.

The voltage input terminals CV1 through CV4 of the cell controller C1 are terminals for measuring the cell voltages. The voltage detection lines SL1 through SL4 are connected to these voltage input terminals CV1 through CV4 respectively, and a resistor RCV for terminal discharge current limitation for terminal protection and capacity adjustment is provided to each of the voltage detection lines SL1 through SL4. Each of the voltage detection lines SL1 through SL4 is connected to a voltage input terminal CV1 through CV4, and to the connection point between the negative electrode of one cell BC and the positive electrode of the next cell BC in series (or, in the case of the voltage detection line SL1, to the positive electrode of the cell BC1). It should be understood that the voltage detection line SL5 is connected from the negative electrode of the cell BC4 to the GND terminal. For example, if the cell voltage of the cell BC1 is to be measured, then the voltage between the voltage input terminals CV1 and CV2 is measured. Moreover, if the cell voltage of the cell BC4 is to be measured, then the voltage between the voltage input terminal CV4 and the terminal GND is measured. Capacitors Cv and Cin are provided between the voltage detection lines SL1 through SL4 as countermeasures against noise. Moreover, as will be described hereinafter, portions of these voltage detection lines on the cell sides and portions thereof on the side of the cell controller IC are connected together by connectors that connect together the battery module and the battery control device.

In order to fully exploit the performance of the battery module 20 of FIG. 2, it is necessary to equalize the cell voltages of all of the sixteen cells. For example, if the variation between the cell voltages is large, then during regenerative charging it is necessary to stop the regeneration operation at the time point that the cell whose voltage is highest reaches its upper limit voltage. In this case, the regeneration operation is stopped irrespective of whether or not the cell voltages of the other cells have reached their upper limits, and this entails a useless consumption of energy by braking. In order to prevent this type of occurrence, upon a command from the microcomputer 30, each of the cell controller ICs performs discharge for adjusting the capacities of the cells.

As shown in FIG. 3, each of the cell controller ICs is provided with balancing switches BS1 through BS4 for cell capacity adjustment between the respective terminal pairs CV1 and BR1, BR2 and CV3, CV3 and BR3, and BR4 and GND. For example, if discharge of the cell BC1 is to be performed, then the balancing switch BS1 is turned to ON. When this is done, a balancing current flows along the following path: the positive electrode of the cell BC1→ the resistor RCV→ the terminal CV1→the balancing switch BS1→the terminal BR1→the resistor RB→ the negative electrode of the cell BC1. It should be understood that RB and RBB are resistors for this balancing, and BR1 through BR4 are terminals for performing this balancing.

In this manner, the balancing switches BS1 through BS4 are provided within the cell controller IC for adjustment of the amounts of charge of the cells BC1 through BC4. In an actual cell controller IC, PMOS switches are used for the balancing switches BS1 and BS3, and NMOS switches are used for the balancing switches BS2 and BS4.

The opening and closing of these balancing switches BS1 through BS4 is controlled by a discharge control circuit 132. On the basis of a command from the microcomputer 30, a command signal for making a balancing switch corresponding to a cell that is to be discharged go to continuous is sent from the IC control circuit 123 to the discharge control circuit 132. And, according to communication from the microcomputer 30, the IC control circuit 123 receives commands for discharge time periods corresponding to each of the cells BC1 through BC4, and performs the discharge operations described above.

The communication systems 602 and 604 are provided between the cell controller IC1 and the cell controller IC2 as described above. Communication commands from the microcomputer 30 are inputted to the communication system 602 via the photocoupler PH, and are received at the receive terminal LIN1 of the cell controller IC1 via the communication system 602. And data and commands corresponding to communication commands are transmitted from the transmit terminal LIN2 of the cell controller IC1. Reception and transmission are performed in order between the cell controller ICs in this manner, and transmitted signals are transmitted from the transmit terminal LIN2 of the cell controller IC2, and are received at the receive terminal of the microcomputer 30 via the photocoupler PH. And, according to the communication commands that they have received, the cell controllers IC1 and IC2 perform transmission of measurement data for cell voltage and so on to the microcomputer 30, and also perform balancing operation. Furthermore, the cell controllers IC1 and IC2 also detect cell over-charging on the basis of the cell voltages that have been measured. The result of this detection (i.e. an anomaly signal) is transmitted to the microcomputer 30 via the communication system 604.

As countermeasures against ESD, diodes D1 and D2 for protection against ESD are provided to each of the cell controllers ICs, for example corresponding to each of the voltage detection lines SL1 through SL5. These diodes are provided in orientations such that current does not normally flow through them.

A Prior Art Construction for Connecting Between a Battery Assembly and a Battery Control Device Next, with reference to FIG. 4, a problem will be explained with regard to the prior art connection construction between the battery assembly (i.e. the cell groups) and the battery control device. In this figure, only the portion of FIG. 2 that includes the battery module 20 and the cell controllers IC1 through IC4 is shown. It should be understood that in order to explain the problems with this prior art connection construction in relation to ESD protection, versus the advantages provided by the connection construction according to the present invention, only those portions of the circuitry of cell controller ICs will be shown that are relevant to this explanation. Moreover it should be understood that, in the following explanation, the connector that connects together the battery module and the battery control device consists of a battery module side connector, and a battery control device side connector that fits into that battery module side connector.

Figure 4:
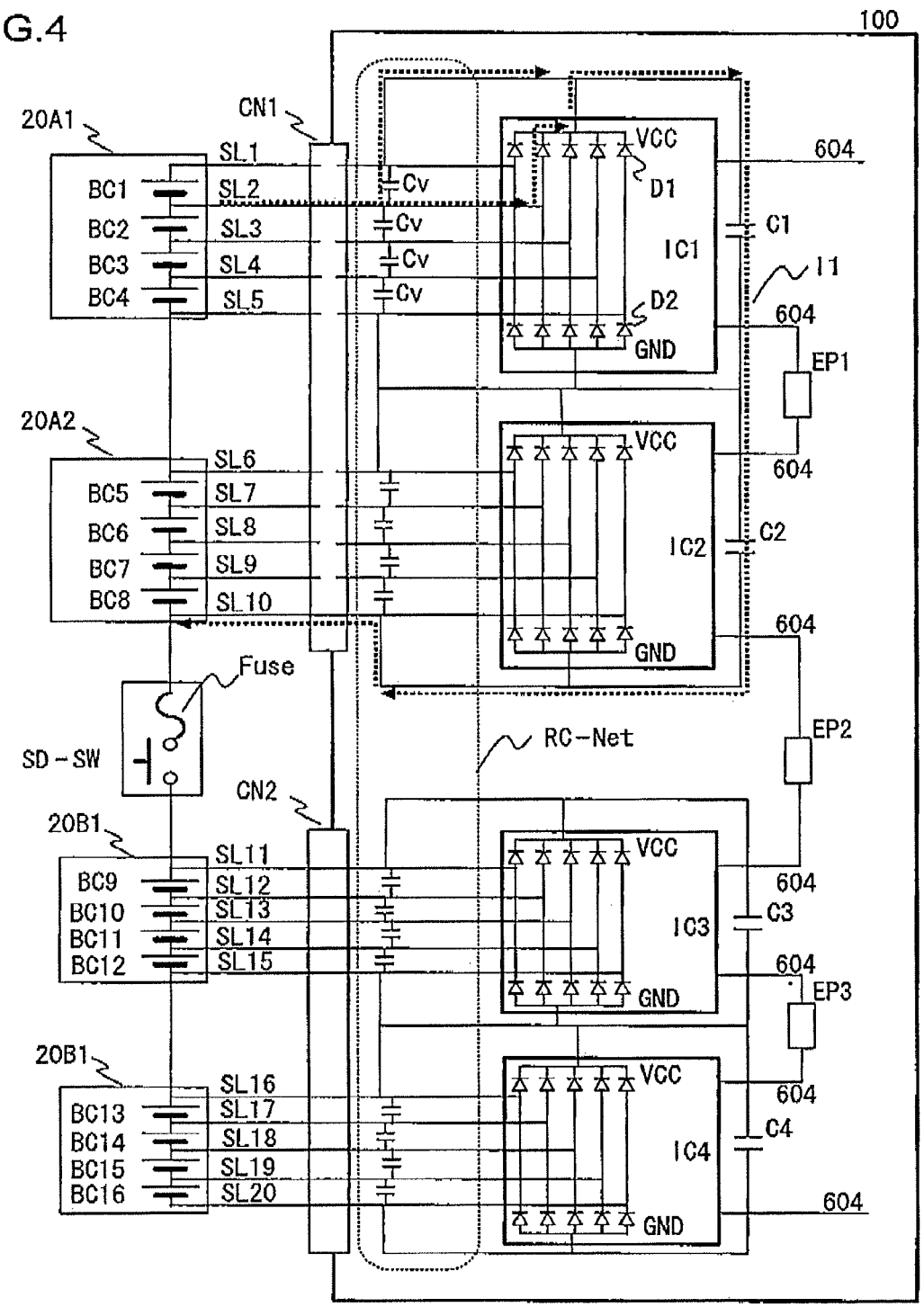
FIG. 4 is a figure for explanation of problems related to ESD with a prior art construction for connection between an battery assembly and ICs for cell control.

In FIG. 4, the battery module blocks 20A and 20B are shown. In the battery module block 20A, BC1 through BC8 are unit cells such as lithium unit cells or the like and SL1 through SL10 are voltage detection lines for detection of the terminal voltages of these cells; and CN1 is a connector for connecting the voltage detection lines SL1 through SL10 to the battery control device 100. This connector CN1 relates to the battery module block 20A; in other words, the connector CN1 is a module block connector that connects the cell groups 20A1 and 20A2 of the battery module block 20A respectively to the cell controllers IC1 and IC2 that control these cell groups. The same holds for a module block connector CN2 and the other battery module block 20B. Thus, the connector CN2 is a module block connector that connects the cell groups 20B1 and 20B2 of the battery module block 20B respectively to the cell controllers IC3 and IC4 that control these cell groups.

In the region RC-Net in FIG. 4 surrounded by the broken line, as shown in FIG. 3, wiring circuitry is installed that includes the voltage detection lines SL1 through SL20 and protective circuitry and discharge circuitry including the capacitors denoted by the reference symbols Cv and Cin and the resistors denoted by the reference symbols RCV and RB. VCC side and GND terminal side wiring external to the cell controllers IC1 through IC4 is also included in this region RC-Net; and, as noise countermeasures, it would also be possible to install further capacitors or the like not shown in the figures. The reference symbol SD-SW denotes the previously mentioned switch for cutting off the main circuit of the battery during maintenance or the like (i.e. the service disconnection unit). A fuse denoted by "Fuse" is housed internally in this switch SD-SW, for cutting off the circuit if an anomalous current should flow in the battery.

The cell controllers IC1 through IC4 are integrated circuits that have the function of measuring the cell voltages. Each of these cell controllers IC contains terminals of power supply and GND denoted respectively by VCC and GND, and diodes D1 and D2 and so on for ESD (electrostatic discharge) protection. As previously described, the one bit communication system 604 is a communication path for transmission of an anomaly signal when cell over-charging has been detected. And C1 through C4 are bypass capacitors for voltage stabilization of the cell controller ICs, while EP1 through EP3 are electronic components such as resistors or capacitors and so on provided for current limitation and are provided upon the communication path 604 between the cell controller ICs.

With the connection construction for connecting between the battery assembly and the battery control device shown in FIG. 4, there is a possibility of failure of one or more of the cell controller ICs within the battery control device 100. For example since, when the hot wires are connected between the charged battery and the battery control device 100 using a conventional connector, it is not possible to control the order in which the connector pins become connected, accordingly, depending upon the order in which the voltage detection lines become connected, there is a fear that damage may be caused to the cell controller IC1 or IC2 within the battery control device 100.

The mechanism by which one or more of the cell controller ICs may suffer damage will now be explained. Suppose that, for example, the voltage detection lines SL2 through SL10 are initially connected, but that the other voltage detection lines are not connected. In this case, as shown by the thick broken lines with arrows in FIG. 4, a charging current I1 for the bypass capacitors C1 and C2 flows from the voltage detection line SL2 via an ESD diode D1 and the bypass capacitors C1 and C2 within the cell controller IC1 to the voltage detection line SL10. If this charging current I1 is greater than the permitted current for the diode D1 within the IC1, then damage to the cell controller IC1, or failure thereof, can occur. While, in order to suppress this flow of current through the diodes D1, it is effective to reduce the flow of current through the diodes D1 within the cell controller IC1 by flowing current to the capacitors Cv by increasing the capacitance values of the capacitors Cv or the like, the problem arises that this entails an increase in cost of the region RC-Net that includes the capacitors Cv.

Furthermore, this charging current I1 depends upon the capacitance values of the bypass capacitors C1 and C2, and on the voltage difference between the voltage detection lines SL2 and SL10. With a system in which the inverter is mounted upon a hybrid automobile or an electric automobile or the like, there is a tendency for the capacitance values of the bypass capacitors C1 and C2 to be made greater, with the objective of enhancing the noise resistance of the inverter. Furthermore, the voltage difference between the voltage detection lines depends upon the number of cell controller ICs that are connected, and this increases according to the number of cells that are connected in series. Accordingly, the more cells are connected in series, the greater does the voltage difference become. It should be understood that, in the previous explanation of FIG. 3, this bypass capacitor C1 was omitted.

While, in FIG. 4, a structure is shown in which the voltage detection lines SL5 and SL6, and SL15 and SL16, are all connected to the battery control device 100, since the voltage detection lines SL5 and SL6 are connected within the battery control device 100, sometimes it may happen that one or the other of them may become disconnected. In a similar manner, sometimes it may happen that one or the other of the voltage detection lines SL15 or SL16 may become disconnected.

Due to the above, when the hot wires are connected between the battery control device 100 incorporating the cell controllers IC1 through IC4 and the battery module 20 (in other words to the cell groups 20A1, 20A2, 20B1, and 20B2), there is a problem with regard to possible damage to these cell controller ICs and failure thereof, and it is necessary to institute countermeasures against such damage.

The Construction for Connecting Between the Battery Assembly and the Battery Control Device in the Present Invention With the present invention, in order to solve the problems described above, it is particularly arranged to connect together the line GNDL that is connected to the GND terminal of the first cell controller IC1 within the control device, and the line VCCL that is connected to the VCC terminal of the second cell controller IC2, with an electrical connection means that is provided on the exterior of the battery control device. In this novel structure the two lines GNDL and VCCL are separated, while in the connection construction of the prior art comparison example shown in FIG. 4 they constituted common wiring between the first cell controller IC1 and the second cell controller IC2. Moreover no special type of connector is used for the present invention, so that it can be implemented with the use of a per se conventional connector. In the following, this will be explained in detail with reference to several embodiments of the present invention.

Embodiment One

Figure 5:
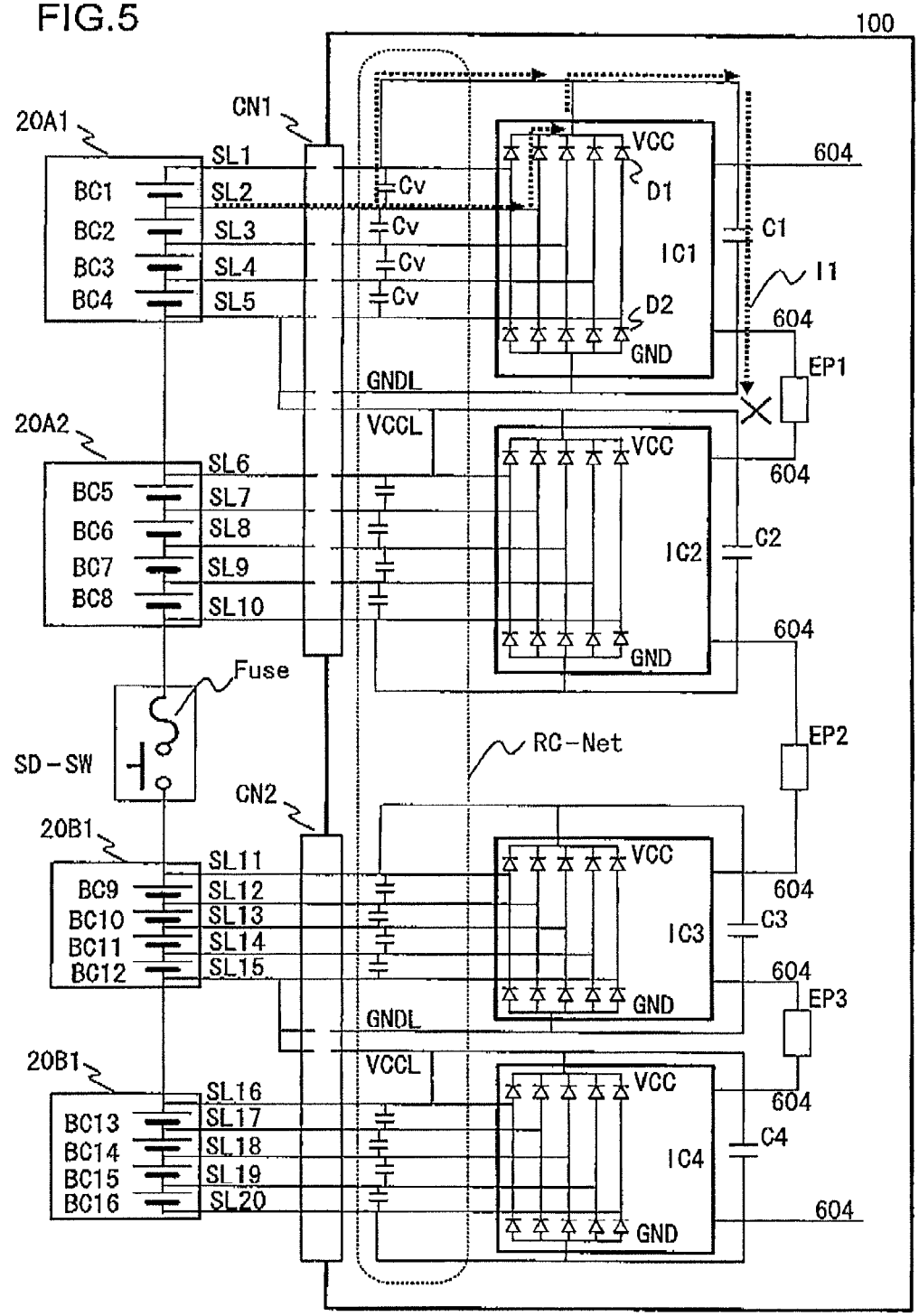
FIG. 5 is an example showing a first embodiment of the present invention in which, between two cell controller ICs, the GND terminal side of the first cell controller IC and the VCC terminal side of the second cell controller IC are connected separately with a connector.

FIG. 5 is an example showing a first embodiment of the present invention. In the following, the same reference symbols are affixed to components that are the same as components shown in FIG. 4, and explanation thereof will be omitted.

To compare this embodiment with the comparison example shown in FIG. 4, the line GNDL on the GND terminal side of the cell controller IC1 and the line VCCL on the VCC terminal side of the cell controller IC2 are connected to the battery module 20A individually and separately via the connector CN1. In other words, a pin on the cell controller IC side connector of the connector CN1 that corresponds to the GND terminal side line GNDL of the cell controller IC1, and a pin on the cell controller IC side connector of the connector CN1 that corresponds to the VCC terminal side line VCCL of the cell controller IC2, are connected together via the cell group side connector of the connector CN1.

In a similar manner, the line GNDL on the GND terminal side of the cell controller IC3 and the line VCCL on the VCC terminal side of the cell controller IC4 are connected to the battery module 20B individually and separately via the connector CN2. In other words, the GND terminal of the cell controller IC1 and the VCC terminal of the cell controller IC2 are not connected together within the battery control device 100, but rather are connected together on the battery module side via the connector CN1, or are connected together by the battery module side connector of the connector CN1; that is to say, this structure is distinguished by the fact that they are electrically connected together on the exterior of the battery control device 100. The same holds for the cell controller IC3 and the cell controller IC4. It should be understood that the battery control side connectors of the connectors CN1 and CN2 could also, for example, be constituted as a plurality of pins provided on the board on the battery control device side.

By adopting this type of structure, it is possible to avoid the problem of damage to or failure of the cell controller ICs, that was the problem with the prior art comparison example. As an example, the case will be explained in which the voltage detection lines SL2 and SL10 are initially connected to the battery control device 100. Let it be supposed that a charging current I1 for the bypass capacitor C1 would flow along the path shown by the broken lines and arrows in the figure (from SL2 via D1 and C1). However, since as described above the GND terminal of the cell controller IC1 and the VCC terminal of the cell controller IC2 are at first not connected together, accordingly no such charging current can flow. Due to this, even if the voltage detection lines SL2 and SL10 are initially connected first, no damage can be caused to the cell controller IC1.

With the connection structure of FIG. 5, the maximum flow of charging current I1 to the capacitor C1 via the diode D1 is if the voltage detection lines SL2 and SL5 are connected. If a circuit design is adopted for a cell controller in which it is possible to guarantee resistance against such maximum flow of charging current in the case of hot wire connection of the voltage detection lines (in this case, of the lines SL1 through SL5), then this will not present any problem.

For example, even if simultaneous connection is established at three locations, i.e. at the voltage detection line SL2, at the GND terminal on the side of the cell controller IC1 having the voltage detection line SL5, and at the VCC terminal on the side of the cell controller IC2, since the charging current for the capacitor C1 is caused to flow by the potential difference between SL2 and SL5, it is not necessary even to consider charging by any greater voltage.

While in FIG. 5 it was arranged for the voltage detection lines SL5 and SL6, and SL15 and SL16, to be connected to the battery control device 100, since the voltage detection lines SL5 and SL6 are connected within the battery control device 100, sometimes it happens that the line SL6 becomes disconnected. Similarly, sometimes it happens that the voltage detection line SL16 becomes disconnected.

The present invention is an expedient for protecting the cell controller ICs during a hot wire connection, when the cell controller ICs are connected in a multi-stage configuration. If communication between several cell controller ICs that are connected in a multi-stage configuration is performed by a daisy chain connection, then it is necessary to give consideration to the possibility that, due to hot wire connection of the voltage detection lines, a malfunction may occur in the communication signal line between the cell controller ICs due to an excessively great current flowing in that communication line. For example, as with the present invention, it may be necessary to implement countermeasures in advance against excessive current upon the communication line, such as limiting the current with electronic components EP1 through EP3 that are provided upon the communication line.

Variants of the embodiment explained above may also be implemented as described below.

(1) With the connection structure of FIG. 5, an example was shown in which a single cell controller IC (for example IC1) performed the task of detecting the voltages of four cells; but the present invention could also be applied to a case in which one cell controller IC performs the task of voltage detection for six cells, or for twelve cells.

(2) While sometimes it is the case that, due to the number of cells that are connected in series, the first cell controller is given the task of performing voltage detection for five cells while the second cell controller handles voltage detection for six cells, or the like, so that the various cell controller ICs perform voltage detection for different numbers of cells, it is also possible to apply the present invention to this type of structure.

(3) While one example of the structure of ESD diodes D1 and so on within the cell controller ICs has been shown, the structure of these ESD diodes may be different, depending upon the structure of the cell controller ICs. The point of importance here is that, according to the present invention, during hot wire connection, it is possible to keep to a very low level the transient currents that flow through the elements within the cell controller ICs.

(4) While, with the connection structure of FIG. 5, an example was shown in which sixteen cells were divided into one upper set of eight cells and one lower set of eight cells, and the intermediate switch SD-SW was provided between these two cell sets, this is not to be considered as being limitative; the mounting position of the switch SD-SW, and the series-parallel configuration of the cells, may be varied in a flexible manner. For example, while in the FIG. 5 example the switch SD-SW was installed between the cell group 20A2 and the cell group 20B1, it could also be installed between the cell group 20A1 and the cell group 20A2, or between the cell group 20B1 and the cell group 20B2. Moreover, if a plurality of the battery modules 20 or of the battery module blocks 20A and 20B are connected in series or in series-parallel, then the switch SD-SW may be installed in series in any position in this series connection of battery modules or battery module blocks.

According to the embodiment shown in FIG. 5, the following beneficial operational effects may be obtained.

(1) Since, during the hot wire connection of this battery control device that is provided with the function of detecting the cell voltages to the lines for cell voltage detection, no consideration at all need be given to the order of connection, accordingly there is the beneficial effect that it becomes simple and easy to assemble the battery.

(2) The present invention provides the beneficial effect that, even when the task of exchanging only the battery control device is to be performed by an end user, it is still possible for such an end user to exchange the battery control device in a simple manner, without giving any consideration at all to any particular order or procedure for connecting the battery control device to the battery module.

(3) It is possible to make the section RC-Net and other circuit components within the battery control device where no hot wire connection occurs, using the electronic components such as resistors and so on that only have small capacitance values and are only required to handle low power, so that the advantageous effect is obtained that, along with it being possible to implement the section RC-Net at low cost, it is also possible to reduce the overall cost of the battery control device.

As described above, in this embodiment of the battery control device according to the present invention that includes a plurality of cell controller ICs having a voltage detection function, a line GNDL that is connected to the GND terminal of at least the N-th cell controller IC is provided as the first terminal of the battery control device, a line VCCL that is connected to the VCC terminal of the (N+1)-th cell controller IC is provided as another second terminal of the battery control device, and the first terminal and the second terminal ace connected to the same electrical potential at the exterior of the battery control device. Furthermore, the GND terminal of the N-th cell controller IC and the VCC terminal of the (N+1)-th cell controller IC are not directly short circuited together within the battery control device.

To put this in another manner, with a set of cell controllers that correspond respectively to a set of cell groups that are connected in series, between two cell controller ICs that correspond to any two successive cell groups, the line GNDL on the GND terminal side of the first controller IC and the line VCCL on the VCC terminal side of the second cell controller IC are made as individual and separate lines, and moreover connection between these lines GNDL and VCCL is established at the exterior of the battery control device, using connector pins of connectors CN1 and CN2.

By employing this type of structure, it is possible to prevent current at high voltage flowing between these two cell controller ICs when the battery module and the battery control device are connected together.

By connecting together the VCC and GND terminals of at least one pair of the cell controller ICs in this manner, it is ensured that high current does not flow between the cell controller ICs of the upper and lower cell controllers via that GND terminal and VCC terminal during a hot wire connection when the battery module and the battery control device are connected together, so that it is possible to prevent damage to or failure of the cell controller ICs during hot wire connection of the voltage detection lines.

Variant Embodiment #1 of the First Embodiment

Figure 6:
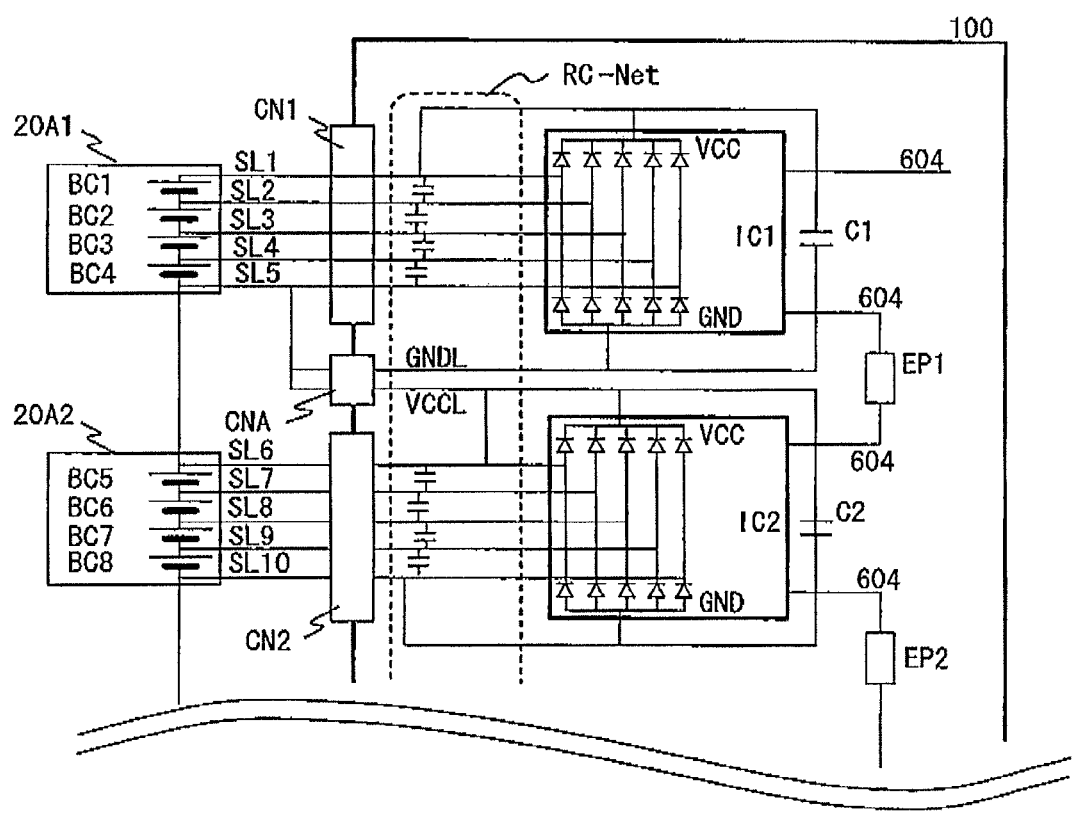
FIG. 6 shows a first variant of the first embodiment of the present invention, in which, with two successive cell controller ICs, the GND terminal side wiring of the first cell controller IC and the VCC terminal side wiring of the second cell controller IC are connected together at the exterior of the battery control device by a connector that is separate from the connector by which the voltage detection lines are connected.

In the variant embodiment shown in FIG. 6, for the upper two of the four cell controller ICs shown in FIG. 5, i.e. for IC1 and IC2, in addition to the first connector CN1 that connects between the cell controller IC1 and the cell group and the second connector CN2 that connects between the cell controller IC2 and the cell group, there is also provided a third connector CNA that connects between the GND terminal side line GNDL of the first cell controller IC and the VCC terminal side line VCCL of the second cell controller IC. A similar structure is provided for the other cell controllers IC3 and IC4, but this is not shown in the figure.

The special feature of this variant embodiment is that, for a pair of successive cell controller ICs, it is arranged to bring the GND terminal side line GNDL of the first controller IC and the VCC terminal side line VCCL of the second cell controller IC out individually to the exterior of the battery control device 100 via the separate connector CNA, and to establish electrical connection between them by connecting them together at the battery module side or in the battery module side connector. By adopting this type of structure, similar advantageous effects can be obtained as in the case of the first embodiment shown in FIG. 5.

While, in FIG. 6, a structure was shown in which each of the voltage detection lines SL5 and SL6 is connected to the battery control device 100, sometimes it happens that SL6 may not be connected, since the voltage detection lines SL5 and SL6 are connected together via the connector CNA.

Moreover, although this possibility is not shown in the figures, it should be understood that the first connector CN1 and the second connector CN2 of this embodiment may also be combined together and made into a single connector that connects the two cell controller ICs as shown in FIG. 5 to the two cell groups.

Variant Embodiment #2 of the First Embodiment

Figure 7:
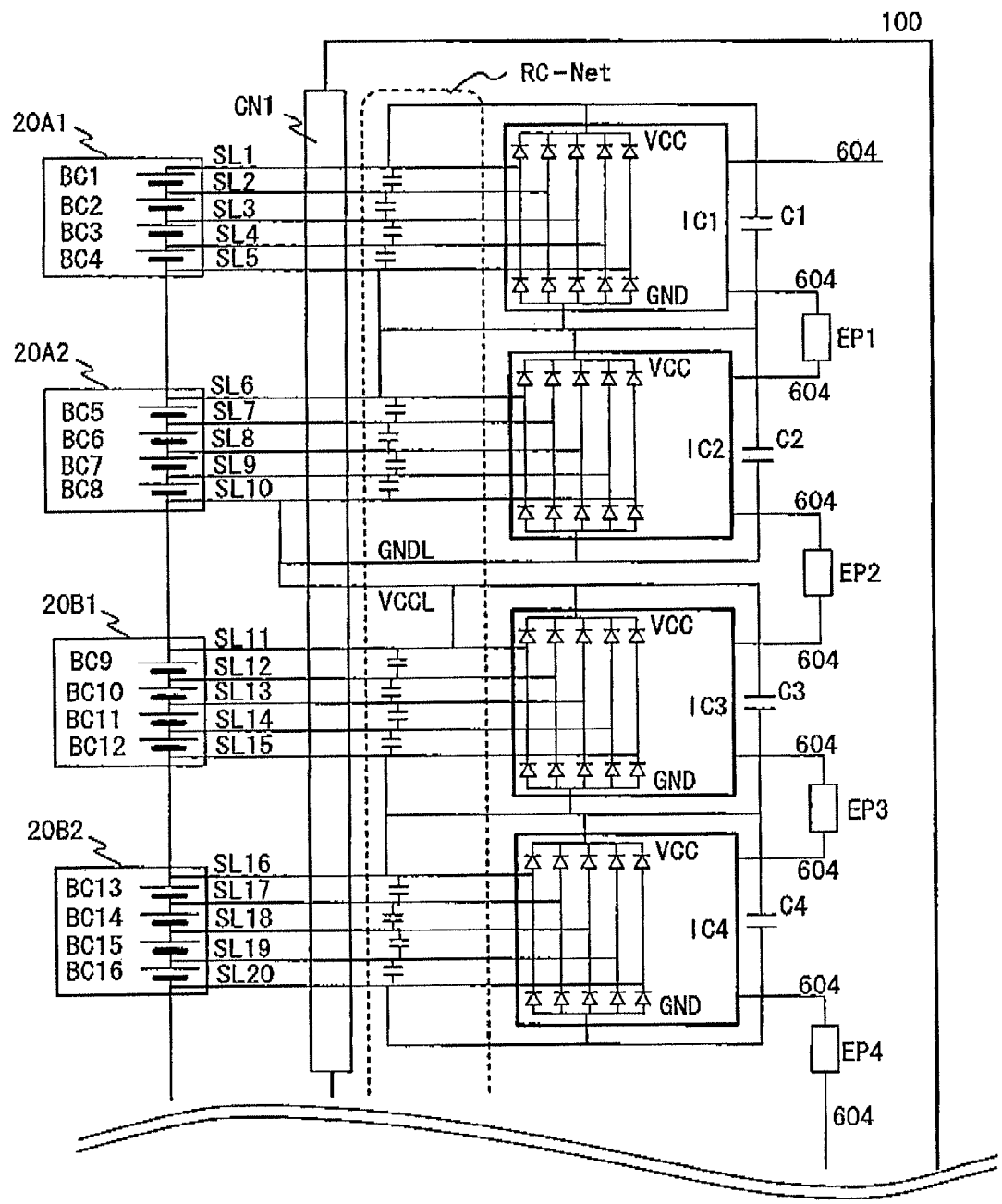
FIG. 7 shows another variant of the first embodiment of the present invention, in which, with four cell controller ICs, the GND terminal side wiring of the second cell controller IC and the VCC terminal side wiring of the third cell controller IC are connected together by a connector on the battery module side.

FIG. 7 shows a second variant embodiment of the first embodiment shown in FIG. 5.

With the structure of this second variant embodiment shown in FIG. 7, all of the voltage detection lines SL1 through SL20 are connected to the battery control device via a single connector CN1. The special feature of this second variant embodiment is that, for each of two cell controller ICs, it is arranged for the connection between the GND and VCC lines of these cell controller ICs to be performed externally to these cell controller ICs, in other words, that it is arranged for them to be connected together externally to the battery control device. That is to say, the connection between the GND and VCC lines of the cell controller IC1 and the cell controller IC2, and the connection between the GND and VCC lines of the cell controller IC3 and the cell controller IC4, are implemented within the battery control device 100, in a similar manner to the case of the comparison example; but it is arranged to implement the connection between the GND and VCC lines of the cell controller IC2 and the cell controller IC3 at the exterior of the battery control device 100. In this case, while it is necessary to design the circuitry in advance so that no damage can occur to the cell controllers IC1 and IC2, no matter what the order of connection of the voltage detection lines SL1 through SL10 that the cell controllers IC1 and IC2 handle may be, the benefit is obtained that it is possible to restrain increase of the number of connector pins as a whole.

It should be understood that, in FIG. 7, the circuitry relating to the sixteen cells from the high voltage side of the battery is described, and illustration of other elements of the structure is omitted. Furthermore, while in this structure each of the voltage detection lines SL5 and SL6, SL10 and SL11, and SL15 and SL16 is connected to the battery control device 100, since the voltage detection lines SL5 and SL6 are connected within the battery control device 100, sometimes it may happen that the line SL6 becomes disconnected. In a similar manner, sometimes it may happen that the line SL16 becomes disconnected. Moreover, since the voltage detection line SL11 comes to the same potential as SL10 after the connector CN1 has been connected, sometimes it happens that this line SL11 becomes disconnected.

While the embodiment shown in FIG. 7 is an example having four cell controller ICs, this concept could be implemented in a similar manner for six cell controller ICs, i.e. IC1 through IC6. In this case, it would be acceptable also to perform connection between GND and VCC of the cell controller IC3 and the cell controller IC4 in the manner described above.

Thus, it is possible to perform connection as described above between GND and VCC for each of two, three, or more cell controller ICs in this manner. Furthermore, it would also be possible to combine connection between GND and VCC for each of two cell controller ICs and connection between GND and VCC for each of three cell controller ICs, and also further to combine this with connection between GND and VCC for each of a different number of cell controller ICs.

In this type of case there is also the advantageous effect that, by separating the cell controller ICs into two or three groups in advance so as to adapt the circuit structure to ensure its resistance during hot wire connection of the voltage detection lines, it is possible to keep down the increase of the number of connector pins for the battery control device consequential upon the application of the present invention to the minimum possible level.

Variant Embodiment #3 of the First Embodiment

Figure 8:
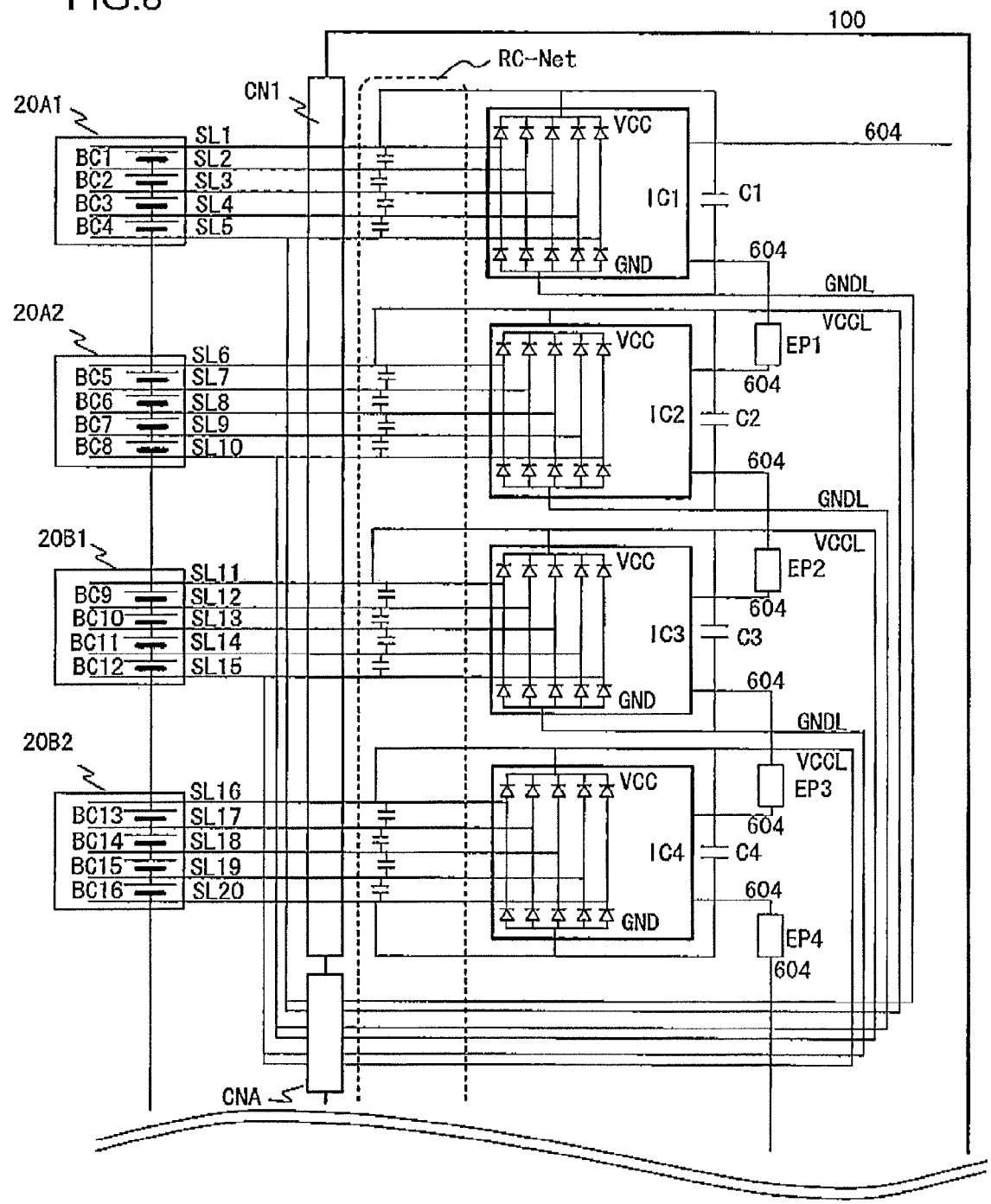
FIG. 8 shows yet another variant of the first embodiment of the present invention, in which VCC terminal side wiring and GND terminal side wiring between two successive cell controller ICs are connected together at the exterior of the battery control device by a connector that is separate from the connector that connects the voltage detection lines.

FIG. 8 shows a third variant embodiment, that is a yet further variant of the first variant embodiment of the first embodiment. In the structure shown in FIG. 8, the distinctive feature is that, within each pair of two successive cell controller ICs, the GND terminal side lines GNDL of the first controller IC and the VCC terminal side lines VCCL of the second cell controller ICs are brought out all together to the exterior of the battery control device 100 via a separate connector CNA, and electrical connection thereof is performed at the exterior of the battery control device 100. By adopting this type of structure, it is possible to reduce the number of connectors CNA provided for each pair of two successive cell controller ICs in the variant embodiment #1 described above.

Here, while in this structure each of the voltage detection lines SL5 and SL6, SL10 and SL11, and SL15 and SL16 is connected to the battery control device 100, sometimes it may happen that the voltage detection lines SL5 and SL6 are not connected, since they come to the same potential after the connector CN1 has been connected. In a similar manner, sometimes it may happen that one of the voltage detection lines SL11 and SL16 is not connected.

Variant Embodiment #4 of the First Embodiment

Figure 9:
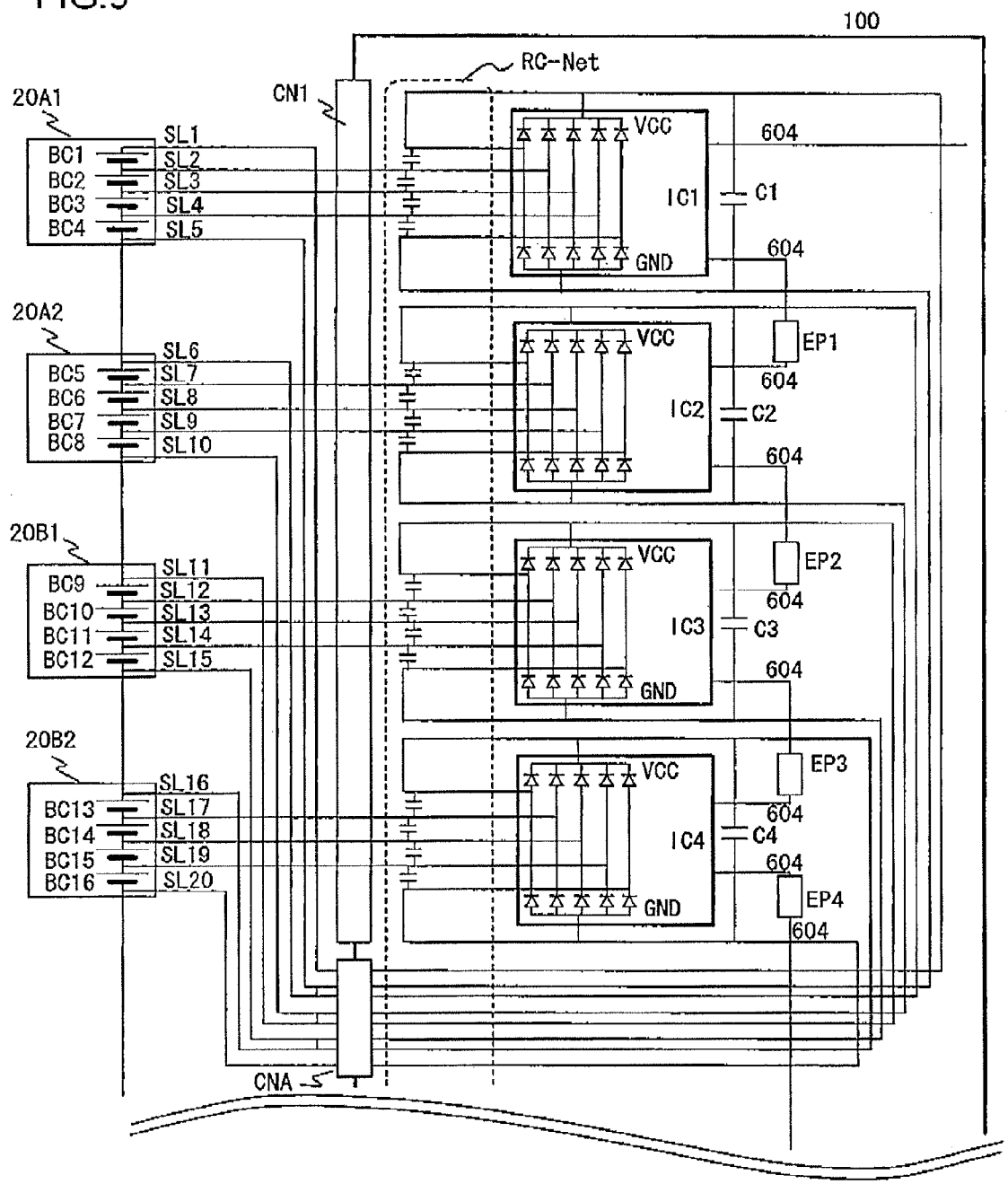
FIG. 9 shows still another variant of the first embodiment of the present invention, in which, in addition to the structure shown in FIG. 5, the connection between the VCC terminal side wiring of the first cell controller IC and the highest level voltage detection line SL1 of the cell group, and the connection between the GND terminal side wiring of the fourth cell controller IC and the lowest level voltage detection line of the cell group, are established at the exterior of the battery control device by a connector different from the one shown in FIG. 8.

FIG. 9 shows a fourth variant embodiment, that is a yet further variant of the first variant embodiment of the first embodiment. With the structure shown in FIG. 9, in addition to the structure shown in FIG. 5, it is also arranged to establish the connection between the VCC terminal side wiring of the cell controller IC1 and the voltage detection line SL1 of the cell group 20A1, and the connection between the GND terminal side wiring of the cell controller IC4 and the voltage detection line SL20 of the cell group 20B2, with the connector CNA. In other words, the distinctive feature of this embodiment is that it is arranged to bring out the VCC terminal side lines and the GND terminal side lines GNDL of the cell controller ICs separately to the exterior of the battery control device 100 via the connector CNA, and to establish their electrical connection at the exterior of the battery control device 100.

Here, while it is arranged for each of the voltage detection lines SL5 and SL6, SL10 and SL11, and SL15 and SL16 to be connected to the connector CAN, it is also possible to have a construction that only one of the voltage detection lines SL5 and SL6 branches into two and is connected to the connector CNA. In a similar manner, it is also possible to have a construction that only one of the voltage detection lines SL10 and SL11, or only one of the voltage detection lines SL15 and SL16, branches into two and is connected to the connector CNA. These constructions are based on the combination of the structures shown in the FIGS. 5 and 9.

With this type of structure, it becomes possible to connect the connector CN1 after having connected the connector CNA. By first connecting the connector CNA, the potentials of the VCC and GND terminals of the cell controllers are established first, and thereafter the voltage detection lines of the cell controller ICs are connected. In this case, the charging up of the bypass capacitors C1 and C2 that are connected between the VCC terminals and the GND terminals of the cell controller ICs is performed first.

Due to this, at the subsequent time point that the voltage detection lines of the connector CN1 are connected, the charging currents to the capacitors C1 and C2 do not flow in the ESD diodes within the cell controller ICs. Accordingly, in this case, the advantageous effect is obtained that it is possible to build the circuitry in the section RC-Net as well with capacitors of small capacitance, or with resistors that can only handle low power, since the transient currents during hot wire connection are small. Moreover, since the connection of the GND terminals and VCC terminals between the cell controller ICs also becomes effective only after the connector CNA has been connected, accordingly the advantageous effect is obtained that, along with it being possible to keep the charging currents for the bypass capacitors C1 and C2 low irrespective of the order of connection of the terminals within the connector CNA, also it is possible to manage with components whose withstand voltage is low.

It should be understood that it would also be possible to implement the above described connectors CN1 and CNA with a single connector, and in this case the beneficial effects that are obtained are similar to those obtained with the first embodiment. However, by employing separate connectors CN1 and CNA as described above, it is possible to reduce the charging current for the bypass capacitors C1 and C2, and it is possible to obtain greater beneficial effects in terms of ESD countermeasures.

Embodiment Two

Figure 10:
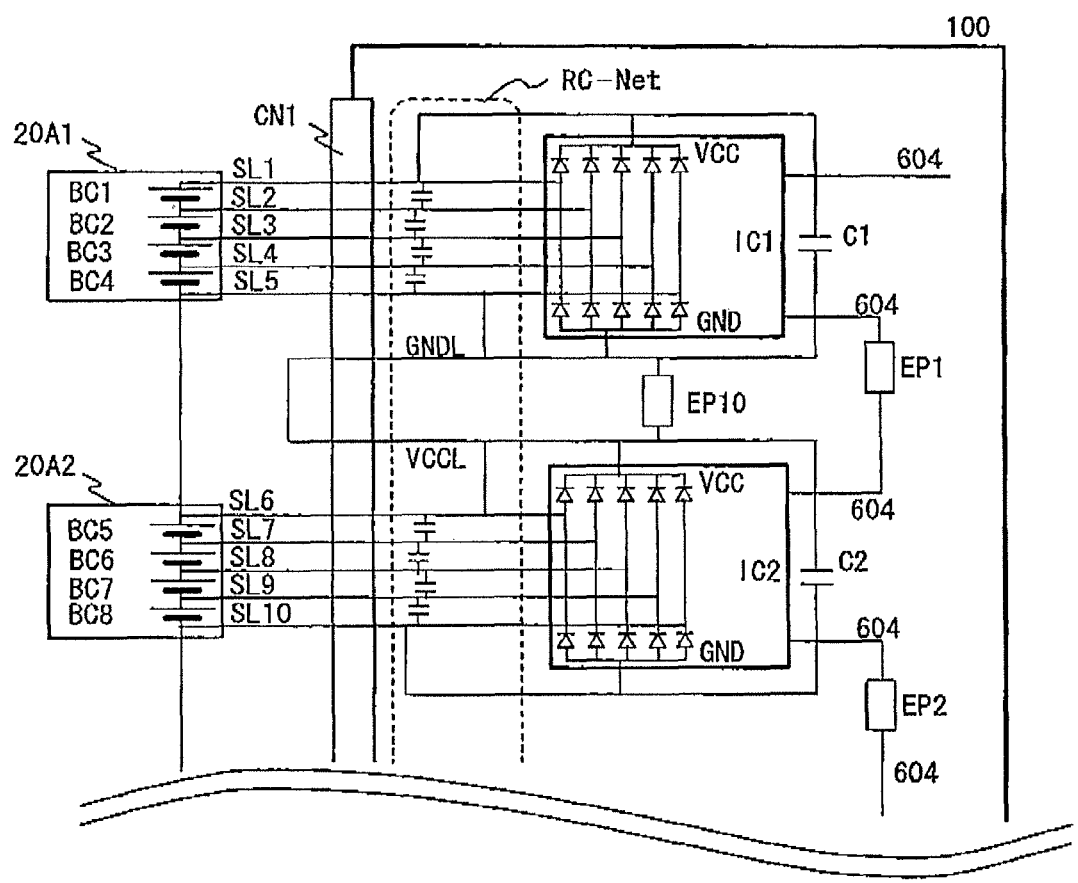
FIG. 10 is an example showing a second embodiment of the present invention, in which an electronic element for current limitation is provided between a pair of two cell controller ICs.

FIG. 10 shows a second embodiment of the present invention. The structure shown in FIG. 10 is distinguished by the feature that an electronic element EP10 that consists of a resistor or a capacitor or the like is provided between the GND terminal side line GNDL of the cell controller IC1 and the VCC terminal side line VCCL of the cell controller IC2. For example, when the voltage detection lines SL2 and SL10 are initially connected, it is ensured that no large charging current can flow, since the charging current through the bypass capacitors C1 and C2 gradually charges them up while being limited by the electronic element EP10. After the connector CN1 has been connected, since GNDL of the cell controller IC1 and VCCL of the cell controller IC2 are short-circuited together at the exterior of the battery control device 100, accordingly no problem arises during circuit operation, because GNDL of the cell controller IC1 and VCCL of the cell controller IC2 are at the same electrical potential during circuit operation. Here, while it is arranged for the voltage detection lines SL5 and SL6 to be connected to the connector CN1, since the voltage detection lines SL5 and SL6 are at the same electrical potential after the connector CN1 has been connected, accordingly sometimes it is the case that one of SL5 and SL6 is not connected.

According to this second embodiment shown in FIG. 10, there is the advantageous effect that, for example, since the gradual charging up of the bypass capacitors C1 and C2 starts at the time point that the voltage detection lines SL1 and SL10 are connected, accordingly it is possible to keep the peak current due to charging of the capacitors C1 and C2 and so on low, and that it is possible to keep low the ratings of the wiring for the paths to the capacitors C1 and C2 and so on, and the ratings of those electronic components themselves.

It should be understood that it would be possible to implement this second embodiment and the first embodiment described above in combination, and, by doing so, it would be possible to obtain even more satisfactory beneficial effects with regard to ESD countermeasures.

A Variant Embodiment of the Diodes for ESD Countermeasures

Figure 11:
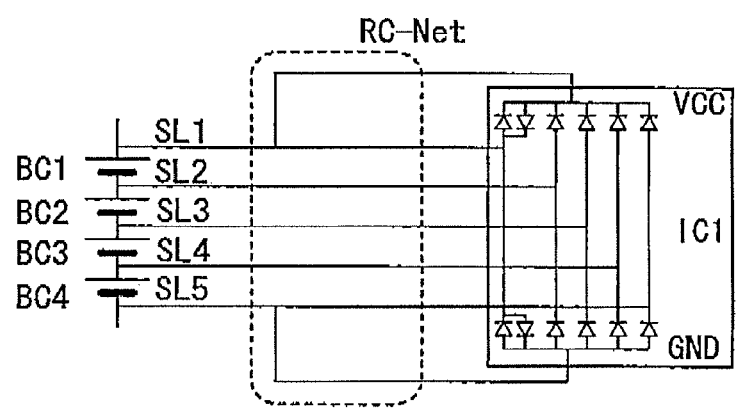
FIG. 11 shows a variant embodiment of a structure of diodes for ESD countermeasures in a cell controller IC.

FIG. 11 shows a variant embodiment of the structure explained above of the diodes for ESD countermeasures in the cell controller ICs. In this variant embodiment, the diode for ESD countermeasures in FIGS. 4 through 10 connected to the voltage detection line SL1 that comes to the same potential as the VCC terminal within the cell controller IC is built as a bidirectional diode. The special characteristic of this circuit is that, because this diode is bidirectional, an ESD noise current applied to the VCC terminal can flow to the side of the voltage detection line SL1, there to be absorbed by the circuitry within the section RC-Net.

In a similar manner, this type of bidirectional diode could also be connected to the voltage detection line SL5 that comes to the same potential as the GND terminal. ESD noise current that is applied to the GND terminal side can flow to the side of the voltage detection line SL5, there to be absorbed by the circuitry within the section RC-Net.

It should be understood that it would also be possible to implement this variant embodiment of the diodes for ESD countermeasures in appropriate combination with the first and second embodiments described above, and, by doing this, it would be possible to obtain yet more beneficial effects with regard to satisfactory ESD countermeasures.

It should be understood that while, in the above explanation, one cell controller IC was provided for each cell group, it would also be possible to control a plurality of cell groups with a single cell controller IC, or to control one cell group with a plurality of cell controller ICs. Moreover, it would also be possible to provide the cell controller ICs by battery module block units, rather than by cell group units.

In this way, it would be possible to combine the numbers of cell controller ICs and the numbers of cells controlled by these cell controller ICs in various different ways, and how many of the cells each of the cell controller ICs controls is basically a matter of design. However, as previously described, the greater is the number of cells controlled by one cell controller, the more necessary is it to employ a circuit design that has sufficient withstand voltage.

It is also possible to control a plurality of cell groups with a single cell controller IC, or to control a large number of cells connected in series with a single cell controller IC. In this type of case, the large number of cells connected in series are divided, for example, into two groups, and, by establishing connection with the battery module side connected as shown in FIG. 5, it is possible to make this connection in safety, even when a large number of cells are connected in series.

Accordingly, as previously explained in connection with the embodiments of the present invention described above, the connection between the battery module and the battery control device may be provided as connectors for respective connections between cell groups and cell controller ICs that correspond to the respective cell groups; or, alternatively, a plurality of cell groups may be connected to a plurality of cell controller ICs with a single connector. Furthermore, if a plurality of ncell groups are controlled with one cell controller IC, then this connection between this plurality of cell groups and this single cell controller IC may be established with a single connector, or may be established with a plurality of connectors. Moreover, even if a single cell group is controlled with a plurality of cell controller ICs, it would still be acceptable to establish this connection between this single cell group and the plurality of cell controller ICs with a single connector, or alternatively with a plurality of connectors.

The present invention can be applied in any of these various cases. The present invention is a construction with which, with two cell controller ICs that are provided in succession so as to control cells that are connected in series, a connection between the GND side terminal of the first cell controller IC and the VCC side terminal of the second controller IC is established in such a manner as to obtain satisfactory ESD countermeasures. As shown in FIG. 5 or FIG. 7, this connection may be established on the battery module side with a single connector, or, as shown in FIG. 6 or FIG. 8, may be established with connectors that are separate and independent from the connector or connectors for connecting the lines for detecting the voltages of the cells.

As has been explained above, according to the connection construction between a battery assembly and a battery control device of the present invention, when connecting the battery assembly and the battery control device together, it is possible reliably to prevent the high voltage of the battery assembly being applied to the integrated circuits within the battery control device, so that it is possible to prevent damage to or failure of the ICs for cell control. Moreover, with the connection construction of the present invention, this connection between the battery assembly and the battery control device can be implemented with a reduced cost using a conventional connector of a type that is in general use.

Furthermore, while in the embodiments of the present invention described above cases have been explained in which the cell groups were connected in series, it would also be possible to apply the present invention in a similar manner if the cell groups are connected in series-parallel. In this case in which the cell groups are connected in series-parallel, the construction of the present invention may be applied to each of the cell groups that are connected in series.

The embodiments of the present invention that have been explained above are only given by way of example, and the present invention should not be considered as being limited to these embodiments. For a person skilled in the relevant art, it would be possible to implement various changes, additions, and omissions without departing from the special features of the present invention. Moreover various types of embodiments may be contemplated, corresponding to the number of cells that are connected.

What is claimed is:

1. A battery control device that is used for a battery module including M cells, where M is a positive number, the battery control device comprising:
    a plurality of integrated circuits that are each provided in correspondence to each of a plurality of cell groups, the M cells being divided into the plurality of cell groups each including N cells, where N is a positive number, that are electrically connected in series, where N<M, and the M cells being electrically connected in series or in series-parallel; and
    a connector configured to electrically connect the M cells and the plurality of integrated circuits, wherein:
    the plurality of integrated circuits each include a VCC terminal electrically connected to a positive electrode side of a highest potential cell of a corresponding cell group and a GND terminal electrically connected to a negative electrode side of a lowest potential cell of a corresponding cell group;
    the VCC terminal and the GND terminal of each integrated circuit are electrically connected with each other via a first path including a capacitor;
    the GND terminal of a first integrated circuit corresponding to a higher potential order cell group and the VCC terminal of a second integrated circuit corresponding to a lower potential order cell group are electrically connected with each other via a second path between the first and second integrated circuits corresponding to the cell groups electrically connected in series; and
    and the second path is formed via the connector through the outside of the battery control device when the plurality of integrated circuits and the M cells are electrically connected by the connector.

2. A battery control device according to claim 1, wherein an electronic component for current limitation is electrically connected between the GND terminal of the first integrated circuit corresponding to the higher potential order cell group and the VCC terminal of the second integrated circuit corresponding to the lower potential order cell group.

3. An electricity storage device, comprising:
a battery control device according to claim 1; and
a battery module including the M cells.

4. A vehicle which can be driven electrically, comprising:
an electricity storage device according to claim 3; and
an electric motor for propulsion drive of the vehicle based on electric power of the electricity storage device.

* * * * *